(12) United States Patent
Arelakis et al.

(10) Patent No.: US 10,846,218 B2
(45) Date of Patent: Nov. 24, 2020

(54) METHODS, DEVICES AND SYSTEMS FOR COMPRESSING AND DECOMPRESSING DATA

(71) Applicant: ZEROPOINT TECHNOLOGIES AB, Gothenburg (SE)

(72) Inventors: Angelos Arelakis, Gothenburg (SE); Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 158 days.

(21) Appl. No.: 16/072,328

(22) PCT Filed: Jan. 27, 2017

(86) PCT No.: PCT/SE2017/050074
§ 371 (c)(1),
(2) Date: Jul. 24, 2018

(87) PCT Pub. No.: WO2017/131578
PCT Pub. Date: Aug. 3, 2017

(65) Prior Publication Data
US 2019/0034334 A1    Jan. 31, 2019

(30) Foreign Application Priority Data

Jan. 29, 2016 (SE) ...................................... 1650119
Jun. 1, 2016 (SE) ...................................... 1650767

(51) Int. Cl.
*H03M 7/40* (2006.01)
*G06F 12/0802* (2016.01)
(Continued)

(52) U.S. Cl.
CPC .......... *G06F 12/0802* (2013.01); *G06F 3/064* (2013.01); *G06F 3/0608* (2013.01);
(Continued)

(58) Field of Classification Search
CPC ............. G06F 12/0802; G06F 12/0811; G06F 3/0659; G06F 3/0673; G06F 3/0608;
(Continued)

(56) References Cited

U.S. PATENT DOCUMENTS 5,410,671 A   4/1995  Elgamal et al.
5,467,087 A   11/1995 Chu
(Continued)

FOREIGN PATENT DOCUMENTS

EP   1074945 A2   2/2001
EP   1107117 A2   6/2001
(Continued)

OTHER PUBLICATIONS

International Search Report and Written Opinion dated Mar. 20, 2017 by the International Searching Authority for Application No. PCT/SE2017/050074, filed Jan. 27, 2017, and published as WO/2017/131578 on Aug. 3, 2017 (Applicant—ZeroPoint Technologies AB) (13 pages).
(Continued)

*Primary Examiner* — Jean B Jeanglaude
(74) *Attorney, Agent, or Firm* — Ballard Spahr LLP

(57) ABSTRACT

Methods, devices and systems for a compressor and a decompressor for encoding and decoding data in the cache/memory/data transferring subsystem in a computer system or in a communication network are described herein. An example variable-length compressor is able to compress blocks of data values and the compressed blocks may include mixes of compressed and uncompressed values, wherein metadata in the form of a unique special-meaning codeword (UUIC) indicates uncompressed values. An example variable-length decompressor is able to decompress the compressed data blocks. The compressor and decompressor are able to support compression and decom-
(Continued)

US 10,846,218 B2

Page 2 pression of common compression scenarios that are used in combination with variable-length compression to improve compressibility in the cache/memory/data transferring subsystem in a computer system or in a communication network.

34 Claims, 30 Drawing Sheets

(51) Int. Cl.
*G06F 3/06* (2006.01)
*G06F 12/0811* (2016.01)
(52) U.S. Cl.
CPC .......... *G06F 3/0659* (2013.01); *G06F 3/0673* (2013.01); *G06F 12/0811* (2013.01); *H03M 7/40* (2013.01); *G06F 3/0656* (2013.01); *G06F 2212/401* (2013.01)
(58) Field of Classification Search
CPC .. G06F 3/064; G06F 2212/401; G06F 3/0656; H03M 7/40; H03M 7/48; H03M 7/30; H04N 19/91; H04N 19/13
USPC .............................................. 341/67, 50, 51
See application file for complete search history.

(56) References Cited

U.S. PATENT DOCUMENTS

| | | | |
|---|---|---|---|
| 5,805,932 A | 9/1998 | Kawashima et al. | |
| 6,067,417 A | 5/2000 | Wise et al. | |
| 6,268,973 B1 | 7/2001 | Bickers | |
| 7,190,284 B1 | 3/2007 | Dye et al. | |
| 7,403,136 B2* | 7/2008 | De La Cruz | H03M 7/3084 341/106 |
| 8,217,813 B2* | 7/2012 | O'Connor | G06F 12/0802 341/106 |
| 8,300,823 B2 | 10/2012 | Bojinov et al. | |
| 8,497,788 B1 | 7/2013 | Miller et al. | |
| 8,898,117 B2 | 11/2014 | Voll et al. | |
| 9,363,339 B2* | 6/2016 | Bhaskar | H03M 7/3088 |
| 9,647,686 B2* | 5/2017 | Master | G06F 16/24561 |
| 9,652,152 B2* | 5/2017 | Oportus Valenzuela | G06F 3/0608 |
| 9,860,561 B2 | 1/2018 | Fenney | |
| 10,498,793 B2 | 12/2019 | Champion | |
| 2002/0097172 A1 | 7/2002 | Fallon | |
| 2002/0131084 A1* | 9/2002 | Andrew | H04N 19/176 358/1.16 |
| 2003/0090709 A1* | 5/2003 | Rijavec | H03M 7/3088 358/1.15 |
| 2003/0130855 A1 | 7/2003 | Babu et al. | |
| 2003/0196078 A1 | 10/2003 | Wise et al. | |
| 2006/0139188 A1 | 6/2006 | Sasakura | |
| 2008/0152235 A1 | 6/2008 | Bashyam et al. | |
| 2008/0228998 A1 | 9/2008 | Colecchia et al. | |
| 2009/0245382 A1 | 10/2009 | Ekman | |
| 2010/0058002 A1 | 3/2010 | Voll et al. | |
| 2013/0007076 A1 | 1/2013 | Wegener | |
| 2013/0272394 A1* | 10/2013 | Brockmann | G06T 9/00 375/240.12 |
| 2013/0311722 A1 | 11/2013 | Arelakis et al. | |
| 2014/0002298 A1 | 1/2014 | Funae | |
| 2014/0101485 A1 | 4/2014 | Wegener | |
| 2015/0381203 A1* | 12/2015 | Master | G06F 16/24561 341/67 |
| 2016/0124659 A1* | 5/2016 | Oportus Valenzuela | G06F 3/0646 711/165 |
| 2016/0226518 A1* | 8/2016 | Master | G06F 16/24561 |
| 2017/0006139 A1 | 1/2017 | Kwon et al. | |
| 2017/0085916 A1 | 3/2017 | Fenney | |
| 2018/0138921 A1 | 5/2018 | Arelakis et al. | |
| 2018/0143770 A1* | 5/2018 | Arelakis | H03M 7/30 |
| 2019/0034091 A1 | 1/2019 | Arelakis et al. | |
| 2020/0007150 A1 | 1/2020 | Lacey et al. | |

FOREIGN PATENT DOCUMENTS

| | | |
|---|---|---|
| SE | 1650767 A1 | 7/2017 |
| WO | WO-2011/033381 A1 | 3/2011 |
| WO | WO-2016/186563 A1 | 11/2016 |
| WO | WO-2016/186564 A1 | 11/2016 |
| WO | WO-2017/131578 A1 | 8/2017 |
| WO | WO-2017/131579 A1 | 8/2017 |

OTHER PUBLICATIONS

Office Action and Swedish Search Report dated Dec. 8, 2016 by the Swedish Patent and Registration Office for Application No. 1650767-5, filed Jun. 1, 2016, and published as SE 1650767 A1 on Jul. 30, 2017 (Applicant—ZeroPoint Technologies AB) (12 pages).
Arelakis, A., et al. "A case for a value-aware cache", IEEE Computer Architecture Letters, vol. 13, No. 1, pp. 1-4, Jan. 21, 2014; abstract; Sections 2 and 5.
Dusser, J. et al., Zero-content Augmented Caches. Proceedings of the 23rd International Conference on Supercomputing (ICS '09) (2009) (23 pages).
Isenburg M et al: "Lossless compression of predicted floating-point geometry", Computer Aided Design, vol. 37, No. 8, Jul. 1, 2005 (Jul. 1, 2005), pp. 869-877.
Islam, M., et al., "Characterizing and Exploiting Small-Value Memory Instructions," in IEEE Transactions on Computers, vol. 63, No. 7, pp. 1640-1655, Jul. 2014; abstract; Section 6.
Pekhimenko, G. et al., Base-Delta-Immediate Compression: Practical Data Compression for On-Chip Caches. Proceedings of the 21st International Conference on Parallel Architectures and Compilation Techniques (PACT '12) (2012) (12 pages).
Thuresson, M., et al., "Memory-Link Compression Schemes: A Value Locality Perspective," in IEEE Transactions on Computers, vol. 57, No. 7, pp. 916-927, Jul. 2008.; abstract; Sections 1, 3, and 6.
Wikipedia, "Floating-point arithmetic" URL: https://en.wikipedia.org/w/index.php?tide=Floatingpoint_arithmetic&oldid=661666669 [retrieved Nov. 30, 2018] (25 pages).
International Preliminary Report on Patentability dated Mar. 12, 2018 by the International Searching Authority for International Application No. PCT/SE2017/050074, filed on Jan. 27, 2017 and published as WO 2017/131578 on Aug. 3, 2017 (Applicant—Zeropoint Technologies AB)(6 Pages).
U.S. Appl. No. 15/575,007 (US-2018/0138921-A1), filed May 20, 2016 (May 17, 2018), Angelos Arelakis.
U.S. Appl. No. 15/575,072 (US-2018/0143770-A1), filed May 20, 2016 (May 24, 2018), Angelos Arelakis.
U.S. Appl. No. 16/072,317 (US-2019/0034091-A1), filed Jan. 30, 2017 (Jan. 31, 2019), Angelos Arelakis.
International Preliminary Report on Patentability dated Dec. 3, 2018 by the International Searching Authority for International Application No. PCT/SE2017/050074, filed on Jan. 27, 2017 and published as WO 2017/131578 on Aug. 3, 2017 (Applicant—Zeropoint Technologies AB)(6 Pages).

* cited by examiner

METHODS, DEVICES AND SYSTEMS FOR COMPRESSING AND DECOMPRESSING DATA

Cross-Reference to Related Applications

This application is a U.S. National Phase Application of International Application No. PCT/SE2017/050074, filed Jan. 27, 2017, which claims priority to Swedish Patent Application Nos. 1650119-9, filed Jan. 29, 2016, and 1650767-5, filed Jun. 1, 2016, each of which are hereby incorporated by reference in their entirety.

TECHNICAL FIELD

This disclosure generally relates to the field of data compression and decompression, for instance in a cache/memory subsystem and/or in a data transferring subsystem of a computer system, or in a data communication system.

BACKGROUND OF THE DISCLOSURE

Data compression is a well-established technique that is used to reduce the size of the data. It is applied to data that are saved in the memory subsystem of a computer system to increase the memory capacity. It is also used when data are transferred either between different subsystems within a computer system or in general when the transfer takes place between two points in a data communication system comprising a communication network.

Data compression requires two fundamental operations: 1) compression (also referred to as encoding) that takes as input uncompressed data and transform them to compressed data by replacing data values by respective codewords (also mentioned in the literature as encodings, codings or codes) and 2) decompression (also referred to as decoding) which takes as input compressed data and transform them to uncompressed by replacing the codewords with the respective data values. Data compression can be lossless or lossy depending on whether the actual data values after decompression are exactly the same to the original ones before being compressed (in lossless) or whether the data values after decompression are different than the original ones and the original values cannot be retrieved (in lossy). Compression and decompression can be implemented in software, or in hardware, or a combination of software and hardware realizing the respective methods, devices and systems.

An example of a computer system 100 is depicted in FIG. 1. The computer system 100 comprises one or several processing units P1 . . . Pn connected to a memory hierarchy 110 using a communication means, e.g., an interconnection network. Each processing unit comprises a processor (or core) and can be a CPU (Central Processing Unit), a GPU (Graphics Processing Unit) or in general a block that performs computation. On the other hand, the memory hierarchy 110 constitutes the storage subsystem of the computer system 100 and comprises a cache memory 120, which can be organized in one or several levels L1-L3, and a memory 130 (a.k.a. primary memory). The memory 130 may also be connected to a secondary storage (e.g., a hard disk drive, a solid state drive, or a flash memory). The memory 130 can be organized in several levels, for example, a fast main memory (e.g., DDR) and a flash memory. The cache memory 120 in the current example comprises three levels, where the L1 and L2 are private caches as each of the processing units P1-Pn is connected to a dedicated L1/L2 cache, whereas the L3 is shared among all the processing units P1-Pn. Alternative examples can realize different cache hierarchies with more, fewer or no cache levels and with or without dedicating caches to be private or shared, various memory levels, with different number of processing units and in general different combinations between the processing units and the memory subsystem, as is all readily realized by a skilled person.

Data compression can be applied to a computer system in different ways. FIG. 2 depicts an example 200 of a computer system, like for instance system 100 of FIG. 1, where data are compressed in the memory, for example in the main memory of such computer system. This means that data are compressed before being saved in the memory by a respective compression operation as mentioned above, and data are decompressed when they leave the memory.

In an alternative example 300 of a computer system, shown in FIG. 3, data compression can be applied to the L3 cache of the cache system. Similarly to the previous example, compression is required before data are saved in the cache and decompression is required before data leave the cache (e.g., to other cache levels (L2) or to the memory 330 where data are uncompressed). In alternative examples data can be saved compressed in any level of the cache hierarchy.

Data can be also compressed only when they are transferred between different subsystems in the computer system. In the alternative example 400 of a computer system shown in FIG. 4, data are compressed when transferred between the L3 cache and the memory 430 using the respective communication means. Similarly to previous examples, compression and decompression need to exist in the ends of the communication means so that data are compressed before being transferred and decompressed when they are received at the other end.

In an alternative example 500 of a computer system, data compression can be applied in a combination of subsystems as depicted in FIG. 5. In this example, data are compressed when they are saved in the memory 530 and when they are transferred between the memory 530 and the cache hierarchy 520. In this way, when data are moved from the cache hierarchy 520 to the memory 530, they may only need to be compressed before being transferred from the L3 cache. Alternatively, the compressed data that leave the memory 530 to the cache hierarchy 520 may only need to be decompressed when they are received to the other end of the communication means that connect the memory 530 to the cache hierarchy 520. Regarding the combination of applying compression to the different subsystems in a computer system, any example is possible and can be realized by someone skilled in the art.

Transfer of data can also take place between two arbitrary points within a communication network. FIG. 6 depicts an example of a data communication system 600 comprising a communication network 605 between two points, where data are transferred by a transmitter 610 and received by a receiver 620. In such an example, these points can be two intermediate nodes in a network or the source and destination nodes of a communication link or a combination of these cases. Data compression can be applied to such a data communication system, as is depicted for an example system 700 in FIG. 7. Compression needs to be applied before data are transmitted by a transmitter 710 onto a communication network 705, while decompression needs to be applied after received by a receiver 720.

There is a variety of different algorithms to realize data compression. One family of data compression algorithms are the statistical compression algorithms, which are data dependent and can offer compression efficiency close to entropy because they assign variable-length (referred to also as variable-width) codes based on the statistical properties of the data values: short codewords are used to encode data values that appear frequently and longer codewords encode data values that appear less frequently. Huffman encoding is a known statistical compression algorithm.

A known variation of Huffman encoding that is used to accelerate decompression is canonical Huffman encoding. Based on this, codewords have the numerical sequence property meaning that codewords of the same length are consecutive integer numbers.

Examples of canonical Huffman-based compression and decompression mechanisms are presented in prior art. Such compression and decompression mechanisms can be used in the aforementioned examples to realize Huffman-based compression and decompression.

An example of a compressor 900 from the prior art, which implements Huffman encoding e.g., canonical Huffman encoding, is illustrated in FIG. 9. It takes as input an uncompressed block, which is a stream of data values and comprises one or a plurality of data values generally denoted v1, v2, . . . , vn throughout this disclosure. The unit 910, which can be a storage unit or an extractor of data value out from the uncompressed block, supplies the Variable-length Encoding Unit 920 with data values. The Variable-length Encoding Unit 920 comprises the Code Table (CT) 922 and the codeword (CW) selector 928. The CT 922 is a table can be implemented as a Look Up Table (LUT) or as a computer cache memory (of any arbitrary associativity) and contains one or a plurality of entries; each entry comprises a value 923 that can be compressed using a codeword, a CW 925 and a codeword-length (cL) 927. Because the set of the various codewords used by statistical compression algorithms is of variable-length, they must be padded with zeros when they are saved in the CT 922 where each entry has a fixed-size width (codeword 925). The codeword-length 927 keeps the actual length of the variable-length encoding (e.g., in bits). The CW selector 928 uses the cL in order to identify the actual CW and discard the padded zeros. The coded value is then concatenated to the rest of compressed values that altogether form the compressed block. An exemplary flow chart of a compression method that follows the compression steps as previously described is depicted in FIG. 25.

An example of a decompressor 1000 from the prior art is illustrated in FIG. 10. Canonical Huffman decompression can be divided into two steps: Codeword detection and Value retrieve. Each of these steps is implemented by a unit: (1) Codeword Detection Unit (CDU) 1020 and (2) Value Retrieve Unit (VRU) 1030. The aim of CDU 1020 is to find a valid codeword within a compressed sequence (i.e., the sequence of the codewords of the compressed data values). The CDU 1020 comprises a set of comparators 1022 and a priority encoder 1024. Each comparator 1022a,b,c compares each potential bit-sequence to a known codeword, which is in this example the First-assigned (at the time of code generation) canonical Huffman codeword (FCW) for a specific length. In alternative implementation, the last-assigned canonical Huffman codeword could be used too, but in that case the exact comparison made would be different. The maximum size of the aforementioned bit-sequence to be compared, which can be saved in a storage unit 1010 (implemented for example as a FIFO or flip flops) and which determines the number of comparators and the maximum width of the widest of them, depends on the maximum length of a valid Huffman codeword (mCL) that is decided at code generation. However, this maximum length can be bounded to a specific value at design, compile, configuration or run time depending on the chosen implementation of such decompressor (e.g., in software or in hardware). The output of the comparators 1022 is inserted into the priority encoder like structure 1024 which outputs the length of the matched codeword (referred to as "matched length" in FIG. 10). Based on this, the detected valid codeword (matched codeword) is extracted from the bit-sequence which is saved in a storage unit 1010; the bit sequence is shifted by as many positions as the "matched length" defines and the empty part is loaded with the next bits of the compressed sequence so that the CDU 1020 can determine the next valid codeword.

The Value Retrieve Unit (VRU) 1030, on the other hand, comprises the Offset table 1034, a subtractor unit 1036 and the Decompression Look Up Table (DeLUT) 1038. The "matched length" from the previous step is used to determine an offset value (saved in the Offset table 1034) that must be subtracted (1036) from the arithmetic value of the matched codeword, determined also in the previous step, to get the address of the DeLUT 1038 where the original data value that corresponds to the detected codeword can be retrieved from it and attached to the rest of decompressed values that are kept in the Decompressed block 1040. The operation of the decompressor is repeated until all the values that are saved compressed in the input compressed sequence (mentioned as compressed block in FIG. 10) are retrieved as uncompressed data values v1, v2, . . . , vn.

An exemplary flow chart of a decompression method that follows the decompression steps as previously described is depicted in FIG. 26.

The aforementioned compressor and decompressor can quickly and effectively compress blocks of data with variable-length canonical Huffman encoding and decompress blocks of data that are compressed with variable-length canonical Huffman encoding. However, they cannot compress and decompress blocks of data that contain mixes of compressed and uncompressed values, a common situation when applying statistical compression to a computer system or a communication network of the aforementioned examples. The present inventors have realized that there is room for improvements in the technical field of data compression and decompression.

SUMMARY OF THE DISCLOSURE

It is an object of the invention to offer improvements in the technical field of data compression and decompression.

This disclosure generally discloses methods, devices and systems for compressing a block of data values and decompressing a compressed block of data values, when compression is applied to for instance the cache subsystem and/or memory subsystem and/or data transferring subsystem in a computer system and/or a data communication system. There are various ways to compress data effectively in said subsystems using entropy-based variable-length encoding and one such way is by using Huffman encoding. Present compressors can be used to compress blocks of data values using Huffman encoding, while present decompressors can be used to decompress said blocks of data that are compressed with Huffman encoding. However, when entropy-based compression is applied in said systems, some data are not compressible or selected to not be compressed; for example, they appear only once hence compressing them requires more metadata than keeping them uncompressed; or there is no encoding for some data values because they never occur during the statistics collection but occur during compression. Said compressors lack therefore important features that make them capable of creating mixes of compressed and uncompressed data values within the same block; and said decompressors lack to distinguish between compressed and uncompressed data when mixed together in a block. The disclosed methods, devices and systems in this disclosure enhance existing compressors and decompressors that utilize variable-length codings, with new features to: compress a data block when comprising a mix of compressed and uncompressed data, a common case when compression is applied in a computer system or communication network; and to decompress a compressed data block when comprising a mix of compressed and uncompressed data in such said systems. Furthermore, the presented methods, devices and systems enhance said compressors and decompressors even further by combining them with other aggressive compressors and decompressors respectively that target common compression scenarios in said computer system and communication network.

A first aspect of the present invention is a data compression device for compressing an uncompressed data block that comprises one or a plurality of data values into a compressed data block, the data compression device comprising:

a compressor configured to compress data values of the uncompressed data block into corresponding variable-length codewords;

a detector configured to detect data values of the uncompressed data block that cannot be compressed by said compressor; and a compressed data block generator configured to generate the compressed data block by combining:

compressed data values in the form of the variable-length codewords corresponding to the data values of the uncompressed data block as compressed by the compressor;

uncompressed data values in the form of the detected data values of the uncompressed data block that cannot be compressed by said compressor; and metadata to indicate the uncompressed data values, wherein the metadata is a unique special-meaning codeword.

Advantageously, the unique special-meaning codeword is one which has been generated together with the variable-length codewords of the compressor at the time of code generation.

More specifically, the unique special-meaning codeword may be generated at the time of code generation by calculating or estimating the frequency of occurrence of all data values that did not appear in a value-frequency table at the time of code generation, wherein their frequency of occurrence in comparison to the total number of occurring data values will affect a width of the unique special-meaning codeword. Hence, the compression efficiency may be improved over prior art approaches by distinguishing with a unique special-meaning codeword the uncompressed data values from the compressed data values within the compressed data block by making use of their frequency of occurrence The more data values that are not captured by a value-frequency tracker at code generation and, accordingly, the more data values that will be left uncompressed in comparison to the total number of data valued occurred, the narrower the unique special-meaning codeword used for indicating the uncompressed data values in the generated compressed data block. On the other hand, the less frequently the number of uncompressed data values occur, the wider the unique special-meaning codeword used for indicating the uncompressed data values in the generated compressed data block.

A second aspect of the present invention is a data decompression device for decompressing a compressed data block into a decompressed data block that comprises one or a plurality of data values, the data decompression device comprising:

a decompressor configured to decompress variable-length codewords of the compressed data block into corresponding decompressed data values; and a decompressed data block generator configured to:

detect metadata in the compressed data block, said metadata being a unique special-meaning codeword indicating uncompressed data values included in the compressed data block; and based on the detected metadata, generate the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

A third aspect of the present invention is a data compression method for compressing an uncompressed data block that comprises one or a plurality of data values into a compressed data block, the data compression method comprising:

compressing data values of the uncompressed data block into corresponding variable-length codewords;

detecting data values of the uncompressed data block that cannot be compressed by said compressor; and generating the compressed data block by combining:

compressed data values in the form of the variable-length codewords corresponding to the data values of the uncompressed data block as compressed by the compressor;

uncompressed data values in the form of the detected data values of the uncompressed data block that cannot be compressed by said compressor; and metadata to indicate the uncompressed data values, wherein the metadata is a unique special-meaning codeword.

A fourth aspect of the present invention is a data decompression method for decompressing a compressed data block into an decompressed data block that comprises one or a plurality of data values, the data decompression method comprising:

decompressing variable-length codewords of the compressed data block into corresponding decompressed data values;

detecting metadata in the compressed data block, said metadata being a unique special-meaning codeword indicating uncompressed data values included in the compressed data block; and based on the detected metadata, generating the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

A fifth aspect of the present invention is system comprising one or more memories, a data compression device according to the first aspect above and a data decompression device according to the second aspect above.

A sixth aspect of the present invention is a computer program product comprising code instructions which, when loaded and executed by a processing device, cause performance of the method according to the third aspect above.

A seventh aspect of the present invention is a computer program product comprising code instructions which, when loaded and executed by a processing device, cause performance of the method according to the fourth aspect above.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Examples from the background art as well as embodiments of inventive aspects are described with respect to the following figures:

FIG. 17b shows an alternative implementation of the data decompression device of FIG. 17a.

DETAILED DESCRIPTION

The present disclosure discloses methods, devices and systems for compressing one or a plurality of blocks of data values and decompressing one or a plurality of compressed blocks of data values, when compression is applied to the cache subsystem and/or memory subsystem and/or data transferring subsystem in a computer system and/or a communication network. The disclosed methods, devices and systems extend and optimize baseline compression methods, devices and systems and decompression methods, devices and systems in order to be applicable for data compression cases that are common in the aforementioned applied systems and also in terms of better compressibility.

Figure 1:
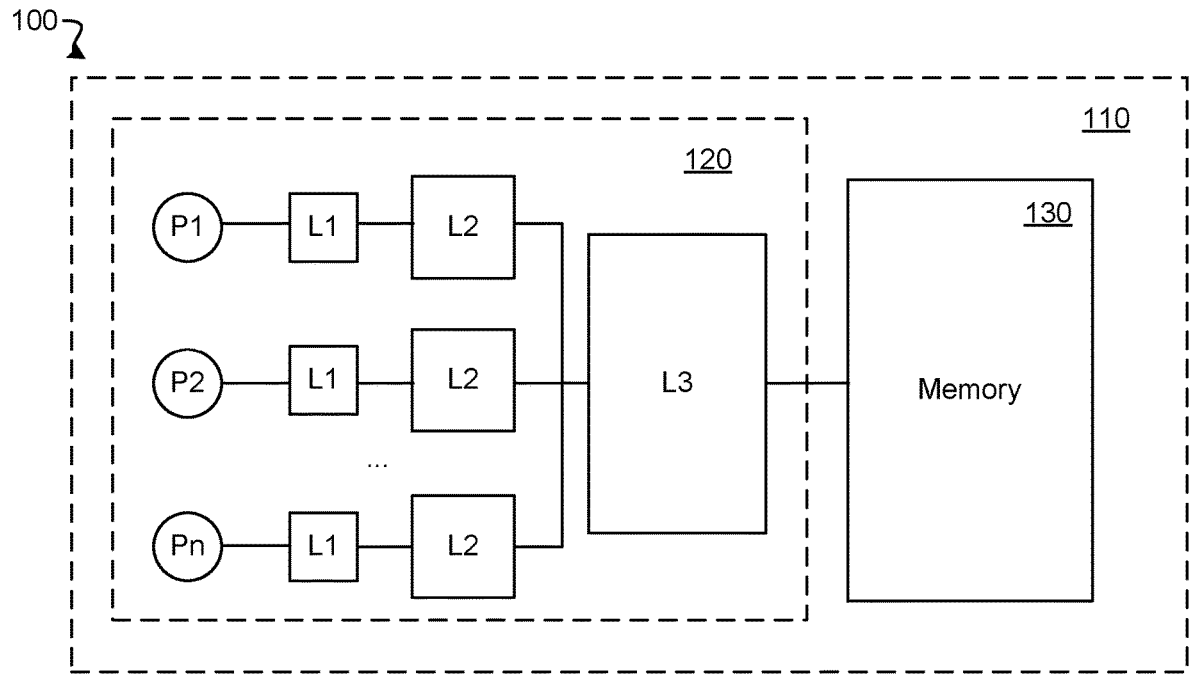
FIG. 1 illustrates a block diagram of a computer system that comprises n processing cores, each one connected to a cache hierarchy of three levels and the main memory.
Figure 2:
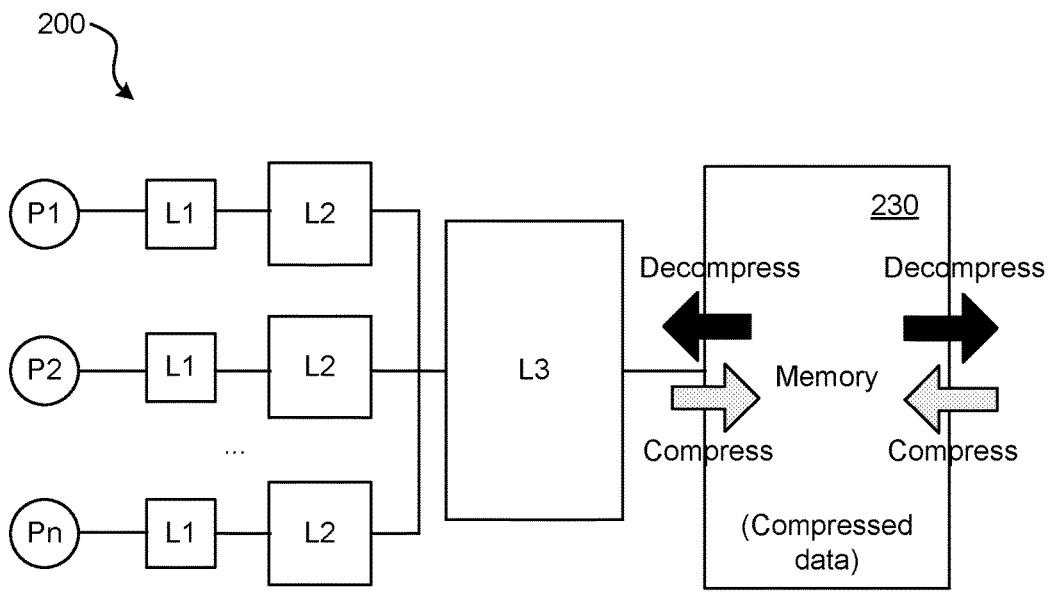
FIG. 2 illustrates the block diagram of FIG. 1, where the main memory saves data in compressed form.
Figure 3:
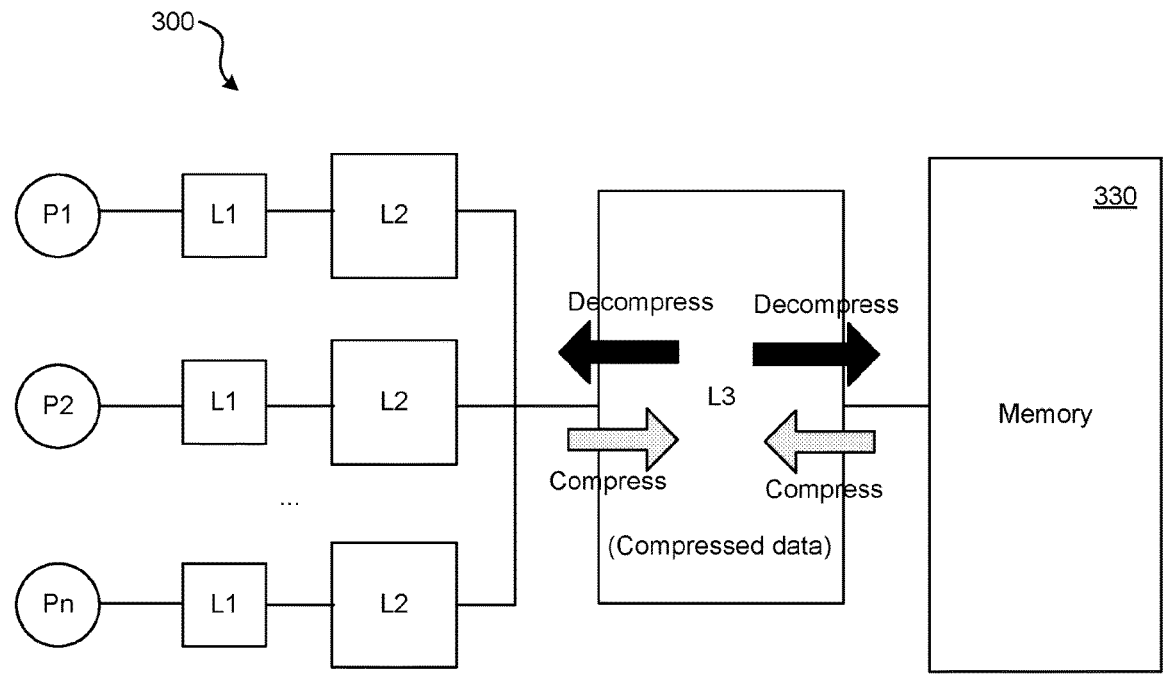
FIG. 3 illustrates the block diagram of FIG. 1, where the L3 cache saves data in compressed form. Other cache levels can also store data in compressed form.
Figure 4:
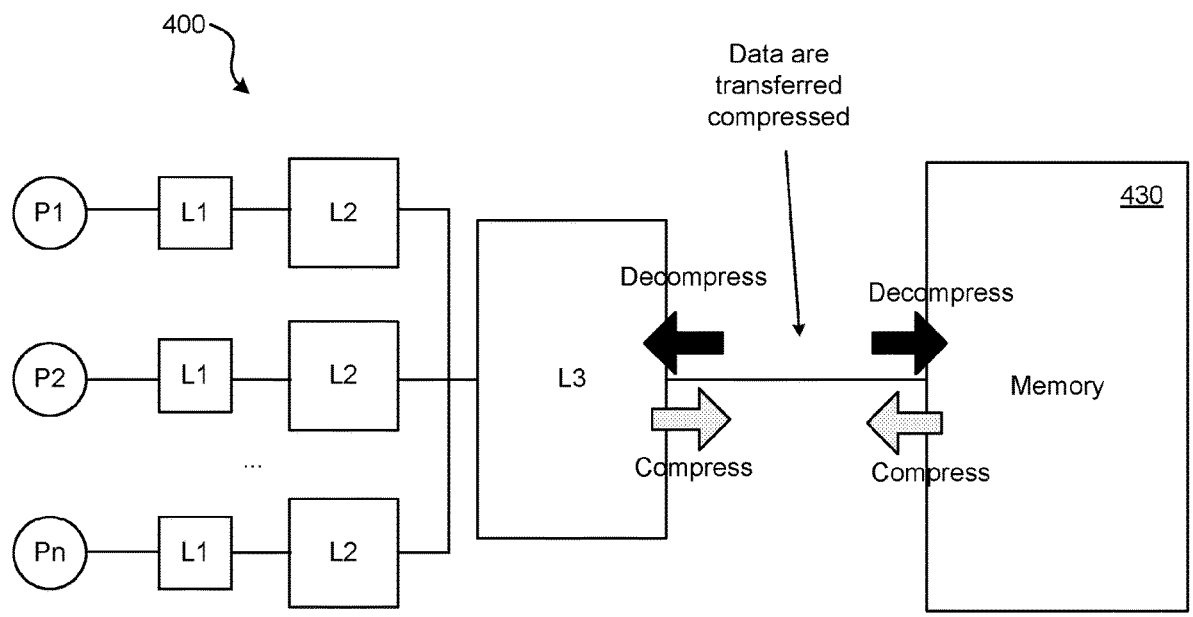
FIG. 4 illustrates the block diagram of FIG. 1 where data are compressed in a communication means, for example when transferred between the memory and the cache hierarchy.
Figure 5:
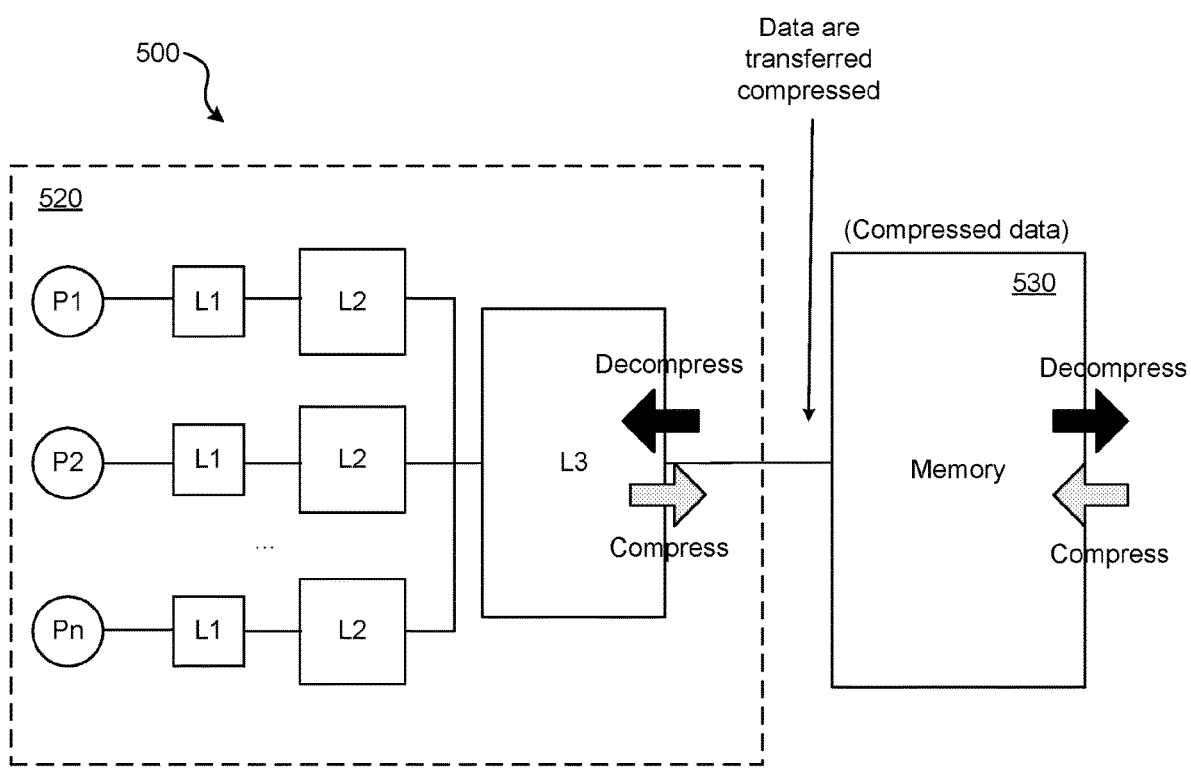
FIG. 5 illustrates the block diagram of FIG. 1 where compression can be applied to the main memory and the link that connects the memory to the cache hierarchy. In general compression can be applied to any combination of the parts like the cache hierarchy, the transferring means (e.g., link that connects the memory to the cache subsystem) and main memory.
Figure 6:
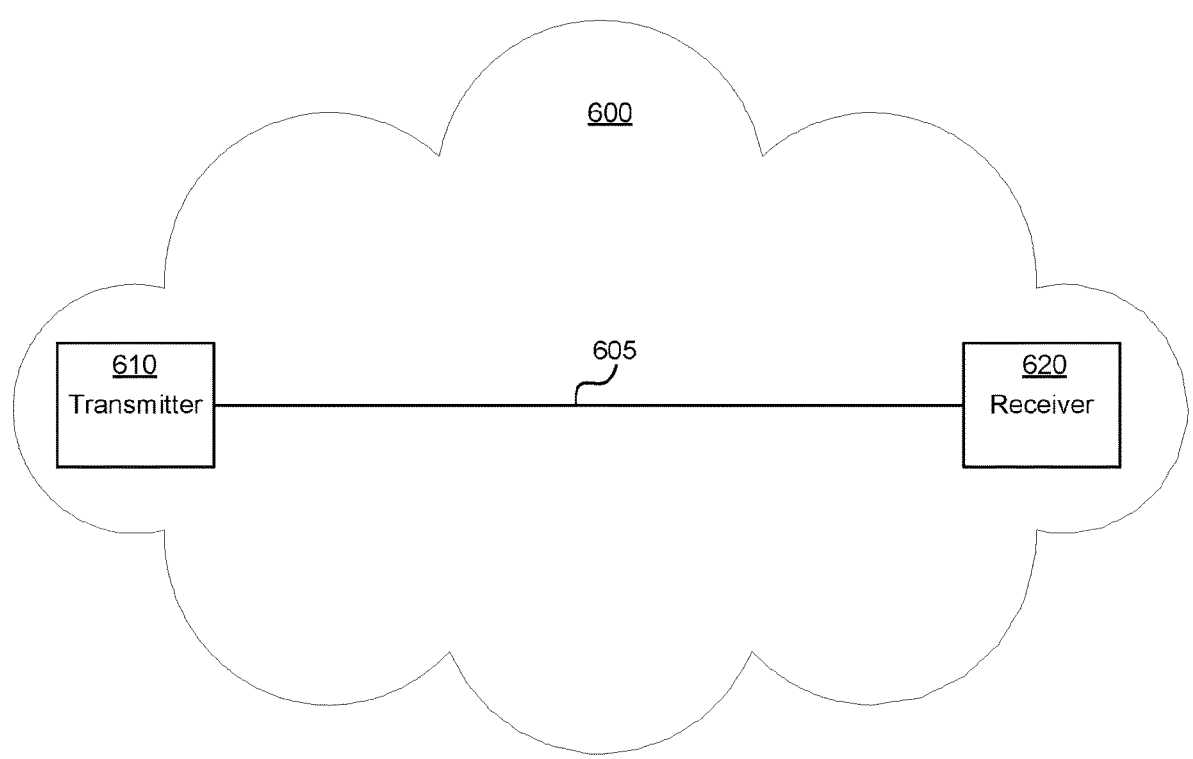
FIG. 6 illustrates a block diagram of a data transmission link that connects two points in a communication network. These points can be two intermediate nodes in the network or the source and destination nodes of a communication link or a combination of these cases.

A data block comprises one or a plurality of data values and can be of arbitrary size. In the embodiment of a computer system, as depicted in FIG. 1, a block of data values can be alternatively referred to as 1) a cache line, a cache set or a cache sector when the block of data is saved in the cache hierarchy, 2) as a cache line, a memory page or a memory sector when the block of data is saved in the memory or transferred in the communication means within such computer system. On the other hand, in the embodiment of a transmission link within a communication network as depicted in FIG. 6, a block of data may also refer to packet, flit, payload, header, etc.

Figure 7:
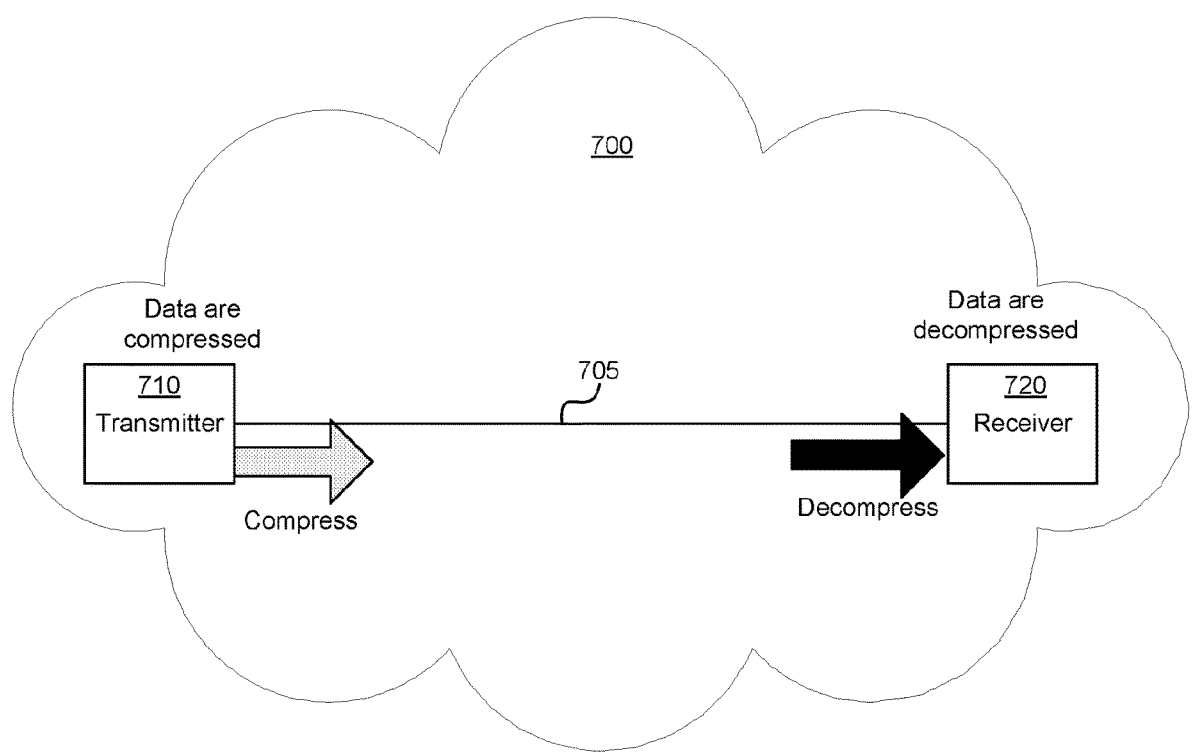
FIG. 7 illustrates a block diagram of the data transmission link of FIG. 6 where the data transferred are in compressed form so they may need to be compressed in the transmitter and decompressed in the receiver.
Figure 8:
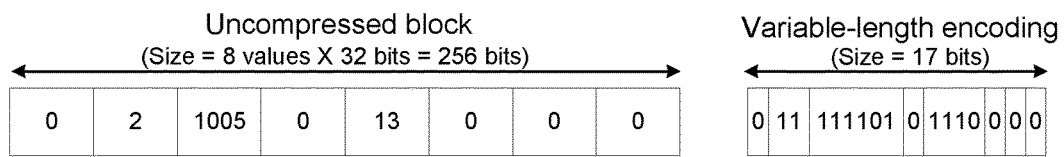
FIG. 8 illustrates on the left an uncompressed block of data values and, on the right, the same block in compressed form using variable-length encoding that has been generated using Huffman coding. All the data values of the uncompressed block are replaced by the respective Huffman codewords.
Figure 9:
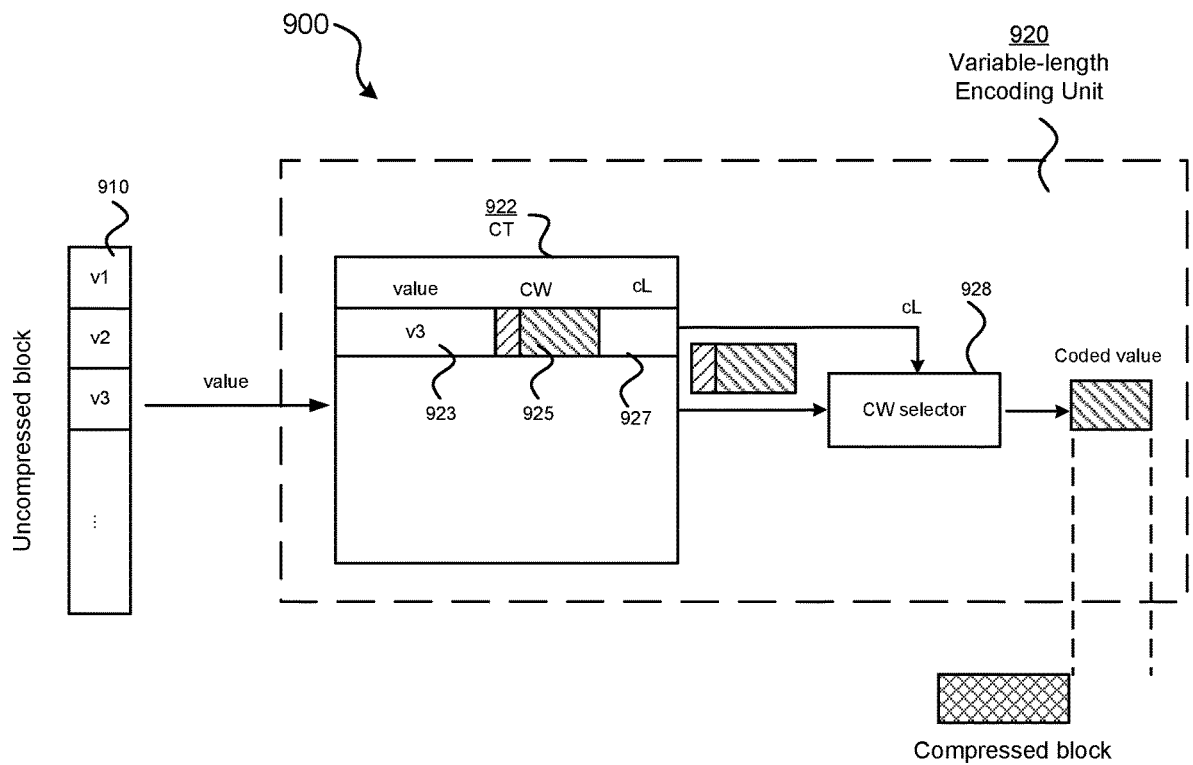
FIG. 9 illustrates a compressor that is used to compress (or encode) blocks using Huffman encoding, as illustrated in FIG. 8.
Figure 10:
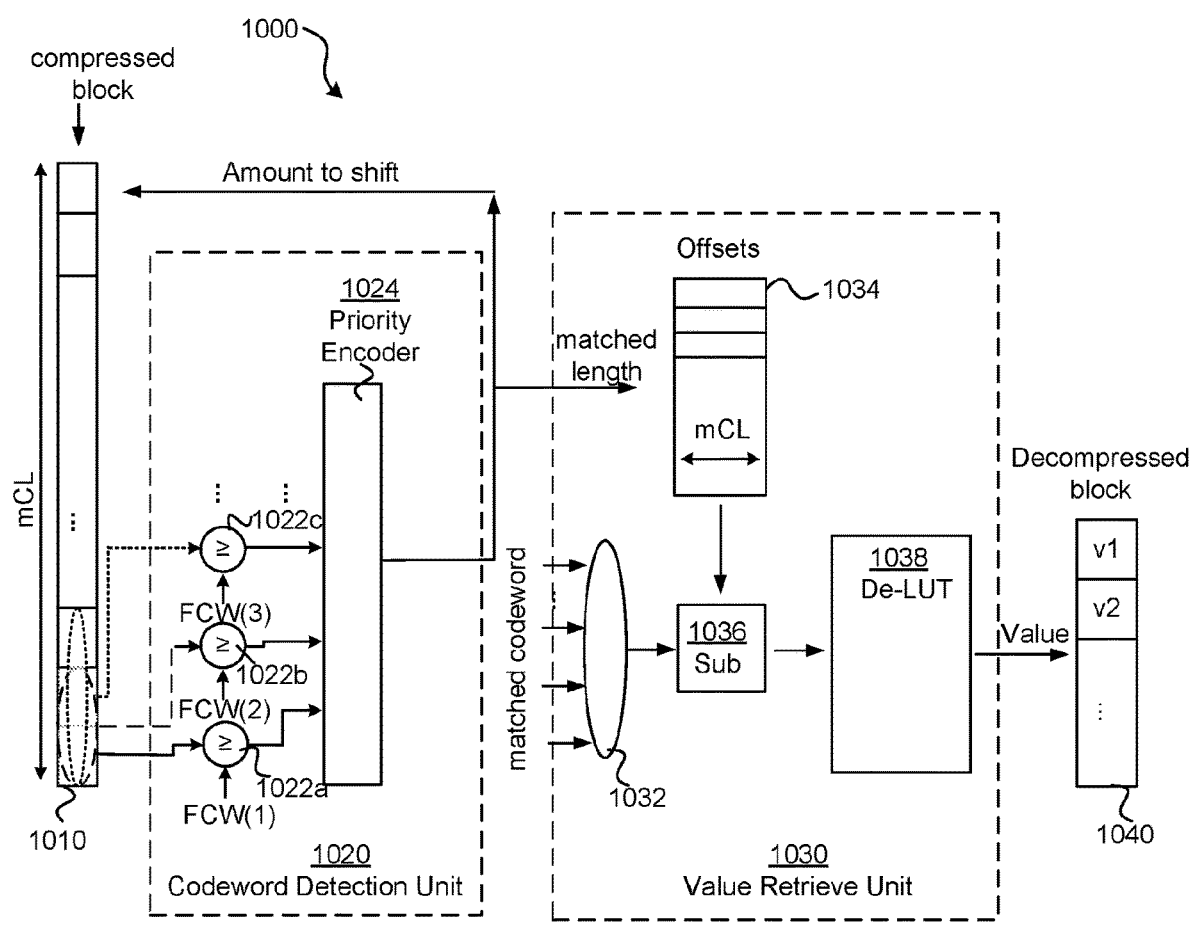
FIG. 10 illustrates a decompressor that is used to decode (or decompress) blocks that were compressed using canonical Huffman encoding.

Variable-length entropy-based compression, such as Huffman compression, can be applied in the context of the cache/memory/data-transfer subsystems of an example computer system as depicted in FIG. 2, FIG. 3, FIG. 4, FIG. 5 or an example communication link as depicted in FIG. 7, to a block of data values as shown on the left of FIG. 8. Said block comprises 8 data values, however it can be of any arbitrary size as mentioned previously (paragraph 0069). All the data values in said block are compressed (or encoded) forming the compressed block, as depicted on the right of FIG. 8, using an example set of canonical Huffman codewords and a prior art Huffman compressor such as the example embodiment of FIG. 9. Furthermore, the example variable-length compressed block of data values is depicted on the right of FIG. 8 can be decompressed by a prior art canonical Huffman decompressor, such as the example embodiment of FIG. 10.

Compressing all the possible data values of one or a plurality of blocks with Huffman encoding requires that Huffman codewords exist for all the data values that can possibly appear in a computer system or transferred in a network. Narrowing down the number of possible data values by reducing the value granularity is one way to tackle this problem. For example, using 1-byte data values to compress with Huffman encoding requires up to 256 Huffman codewords. However, the compression efficiency is reduced when finer grain values are used because the generated codewords are not significantly denser than the replaced data values. Improving the compression efficiency requires to Huffman compress coarse grain data values. The downside of this is that codewords must be generated in advance for all the possible values that may be accessed, increasing this way the resources and metadata needed to store the Huffman encoding in place, to prohibitive sizes. The alternative solution of generating codewords only based on the current set of used data values and regenerate the encoding based on the new values when they appear (e.g., when they are brought in, created, accessed or transferred) is not a viable solution either, for someone skilled in the art due to the overhead imposed because of sampling and code regeneration when compression is applied to cache/memory subsystem, the transferring subsystem and the communication network. In particular when compression is applied to the cache and memory subsystem, it also means that all the previously compressed data values stored must be decompressed and recompressed using the new encodings, potentially introducing a significant overhead to the system.

A viable solution to this problem that allows compressing coarse grain values using variable-length Huffman encoding without maintaining a lot of metadata and without needing to regenerate said Huffman encoding often is by allowing to keep some data values uncompressed. Another motivation towards keeping some data values uncompressed is that when data values occur for a few times (frequency of occurrence is small) they would require more metadata to compress them than keeping them uncompressed yielding eventually more area overhead and more time overhead (due to compression and decompression). A value-frequency table can be used to keep track of the most frequent values and their frequency of occurrence.

When a block of data values contains uncompressed values, it may be kept uncompressed. The present inventors have conceived two possible solutions to allow a mix of compressed and uncompressed data values within a block of data, given that the sequence of data values remains unchanged as in the original uncompressed block. Furthermore, a third solution conceived by the present inventors is used in the alternative to allow rearrangement of the original sequence of data values, without requiring any extra metadata beyond any metadata used by the previous two solutions, when the compressed block is formed.

Figure 11:
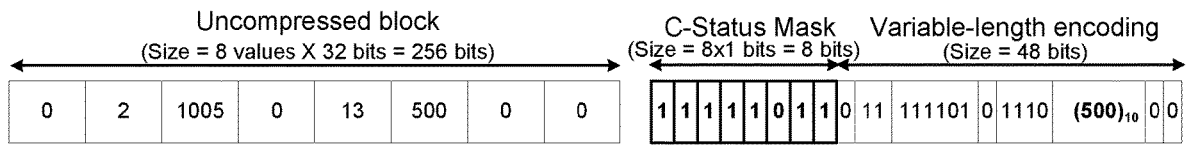
FIG. 11 illustrates on the left an uncompressed block and on the right the same block in compressed form in an alternative way comprising a bit mask, which indicates which values are compressed and uncompressed, and a variable-length encoding (i.e. a bit sequence encoded by variable-length encoding) that comprises a mix of compressed and uncompressed values, according to a related but presently not claimed design.

An example of a compressed data block according to the first solution is depicted on the right of FIG. 11, while the same data block in uncompressed form is shown on the left of it. The compressed data block comprises the variable-length Huffman encoded bit sequence and metadata in the form of a mask of bits (C-Status mask) that appears prior to said variable-length Huffman encoding. Said variable-length encoded bit sequence comprises compressed and uncompressed values. Said mask comprises as many bits as the number of data values contained in the block. Each bit in said mask defines whether the respective data value is compressed (mask bit is, e.g., 1) or not (mask bit is, e.g., 0). The position of the mask bit in mask is used to locate (or count) the respective value in the variable-length sequence of compressed and uncompressed values.

Figure 14:
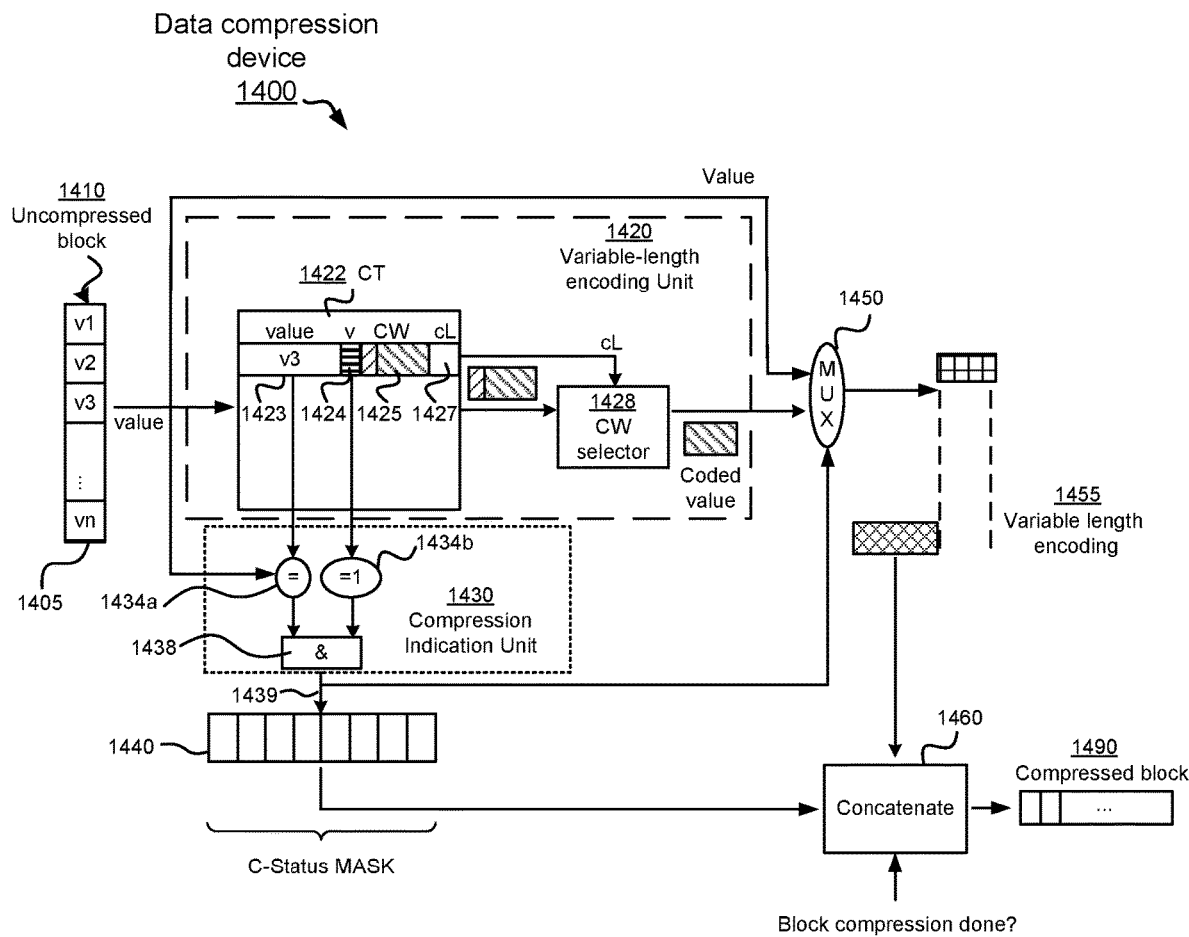
FIG. 14 illustrates a data compression device according to a related but presently not claimed design, based on the compressor of FIG. 9 but modified and extended to be able to compress the block of FIG. 11 by detecting the compressible and uncompressible block data values and generating a mask preceding the variable-length encoded bit sequence, which comprises the compressed and uncompressed values, to indicate the uncompressed values contained in said compressed block.

A block diagram of an example data compression device 1400 that is able to form said compressed block of FIG. 11 is depicted in FIG. 14. It comprises a compressor in the form of a Variable-length Encoding Unit 1420, a detector in the form of a Compression Indication Unit 1430, a Compression Status Register 1440 for storing the C-Status Mask, and other logic 1440, 1450 and 1460 which forms a compressed data block generator. The data compression device takes as input an uncompressed data block 1410, which is a stream of data values and comprises one or a plurality of data values v1, v2, . . . , vn and which can be retrieved from a storage unit 1405 or an extractor of data values out from the uncompressed block, as in the compressor embodiment of FIG. 9. However, the data values of the uncompressed data block 1410 are supplied not only to the Variable-length Encoding Unit 1420 but also to the Compression Indication Unit 1430 and a selector 1450. The Variable-length Encoding Unit 1420 is similar to the Variable-length Encoding Unit 920 of the compressor 900 of FIG. 9 with the difference that the Code Table (CT) 1422 contains in each table entry also a valid bit (v) 1424. The value 1423, codeword (CW) 1425 and code length (cL) 1427 for each CT entry are similar to value 923, CW 925 and cL 927 of the compressor 900 of FIG. 9. The v bit 1424 indicates whether the entry contains a valid CW for the value stored.

The Compression Indication Unit 1430 checks if each incoming data value (candidate for compression) exists in the CT 1422 by comparing it (comparator 1434*a*) to the value 1423 of the matched entry and whether it is valid by checking (comparator 1434*b*) the valid bit 1424 of that entry. If both comparisons are true (indicated by a unit 1438), then there is a valid codeword for the value candidate for compression; otherwise, the value will be saved uncompressed. This information, which is generated as a detection result 1439 by the Compression Indication Unit or detector 1430 (e.g., 1 for a compressed value using a codeword in the CT, 0 for an uncompressed value) is marked in the appropriate position in the C-Status Mask in the Compression Status Register 1440 while the selector 1450 makes the proper selection based also on this information.

Hence, the compressed data block generator 1440-1460 is configured to iteratively build a variable-length encoded bit sequence 1455 (i.e., a bit sequence generated by variable-length encoding) by adding a compressed data value in the form of the variable-length codeword (CW) 1425, or an uncompressed data value v1-vn, depending on the detection result 1439 of the detector 1430 in the order of appearance of the data values in the uncompressed data block 1410, while updating the compression status mask C-Status Mask at a corresponding position in the compression status register 1440) accordingly.

When the block compression is complete (meaning that compression has been attempted for all the block values), the C-Status Mask is retrieved from the Compression Status Register 1440 and is attached in front of the variable-length encoded bit sequence 1455, which comprises the compressed and uncompressed values, using the Concatenate Unit 1460. The outcome of this concatenation is the Compressed block 1490. Hence, the compressed data block generator 1440-1460 is configured to, when all data values of the uncompressed data block 1410 have been processed, to generate the compressed data block 1490 by the concatenator 1460 concatenating the compression status mask C-Status Mask) and the variable-length encoded bit sequence 1455.

Figure 15:
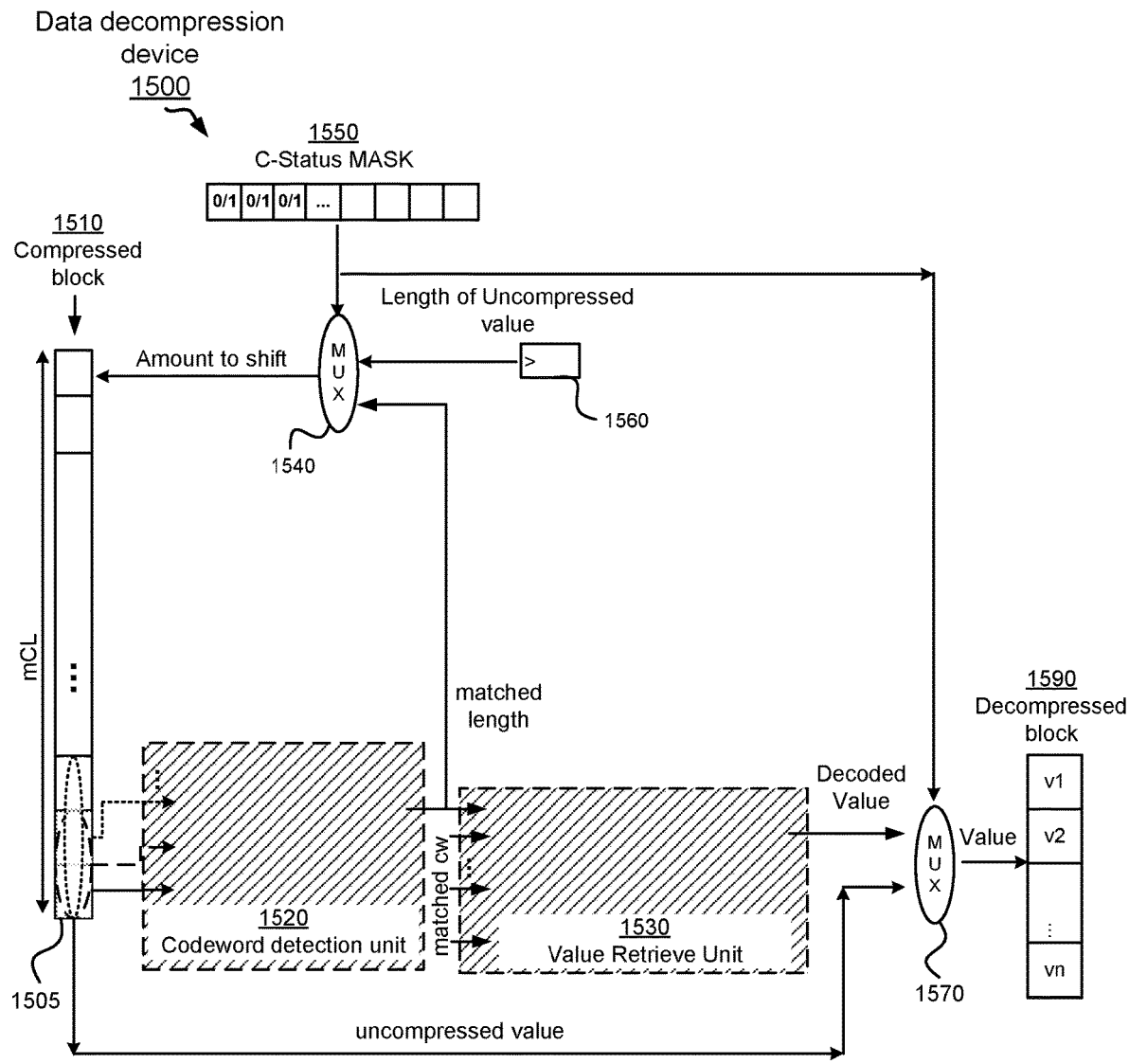
FIG. 15 shows a data decompression device according to a related but presently not claimed design, based on the decompressor of FIG. 10 but modified and extended to be able to decompress the compressed block of FIG. 11 that comprises a mask preceding the variable-length encoded bit sequence to indicate the uncompressed values.

A block diagram of an example data decompression device 1500 that is able to decompress said compressed block of FIG. 11 is depicted in FIG. 15. The data decompression device 1500 is built on the basis of the decompressor 1000 of FIG. 10 and comprises a storage unit 1505, which saves part of the compressed data block 1510 (the size of the storage unit 1510 is at least the maximum of the uncompressed value length and the maximum codeword length), a Codeword Detection Unit 1520 (similar to the Codeword Detection Unit 1020 of the decompressor 1000 of FIG. 10), a Value Retrieve Unit 1530 (similar to the Value Retrieve Unit 1030 of the decompressor 1000 of FIG. 10), and extra logic 1540-1570 which forms a decompressed data block generator. The Codeword Detection Unit 1520 and the Value Retrieve Unit 1530 thus form a decompressor.

The decompressed data block generator comprises a register 1550 for storing the compression status mask, C-Status Mask, as retrieved from the appended part of the compressed data block 1510, selectors 1540 and 1570, and a storage unit 1560. The decompressed data block generator reads the C-Status Mask in every value decompression step to decide whether the current value of the compressed data block 1510 is compressed or uncompressed in order to decide the correct data path. If the C-Status Mask bit is 1 (i.e., current value is compressed), the amount to be shifted is selected by the selector 1540 to be the matched length of the codeword, which is the output of the Codeword Detection Unit 1520, and the value attached to the rest of decompressed value is selected (by the selector 1570) to be the decoded value that is output by the Value Retrieve Unit 1530. On the other hand, if the C-Status Mask bit is 0 (i.e., the value is uncompressed), the selector 1540 will select the length of the uncompressed value, which is of fix length and is typically determined based on the used value granularity (e.g., 32 bits if the symbol granularity is 4 bytes). The uncompressed value is read from the storage unit 1505 and selected by the selector 1570 using the C-Status Mask bit as a control signal. Decompression continues until all the values of the compressed data block 1510 have been processed (i.e. decompressed or read depending on the C-Status Mask bit), and form the decompressed data block 1590 of data values v1 . . . vn.

Hence, the decompressed data block generator 1540-1570 is configured to detect metadata (i.e. the C-Status Mask) in the compressed data block 1510, wherein said metadata indicates uncompressed data values included in the compressed data block, and, based on the detected metadata, generate the decompressed data block 1590 by combining decompressed data values from the decompressor 1520, 1530 and uncompressed data values from the compressed data block 1510, such that the order of the data values v1 . . . vn of the generated decompressed data block 1590 is the same as the order in which the data values appeared in an uncompressed data block (such as block 1410 of FIG. 14) prior to data compression which produced the compressed data block (such as block 1490 of FIG. 14).

More specifically, the decompressed data block generator 1540-1570 is hence configured to retrieve, from the compressed data block 1510, the compression status mask C-Status Mask which indicates positions of compressed data values and uncompressed data values in the compressed data block 1510. The decompressed data block generator 1540-1570 is also configured to generate the decompressed data block 1590 by controlling, for each data value in the compressed data block 1510, the selector 1570 to select a decompressed data value from the decompressor 1520, 1530 or an uncompressed data value from the compressed data block, based on a bit value at a corresponding position in the compression status mask C-Status Mask.

Figure 25:
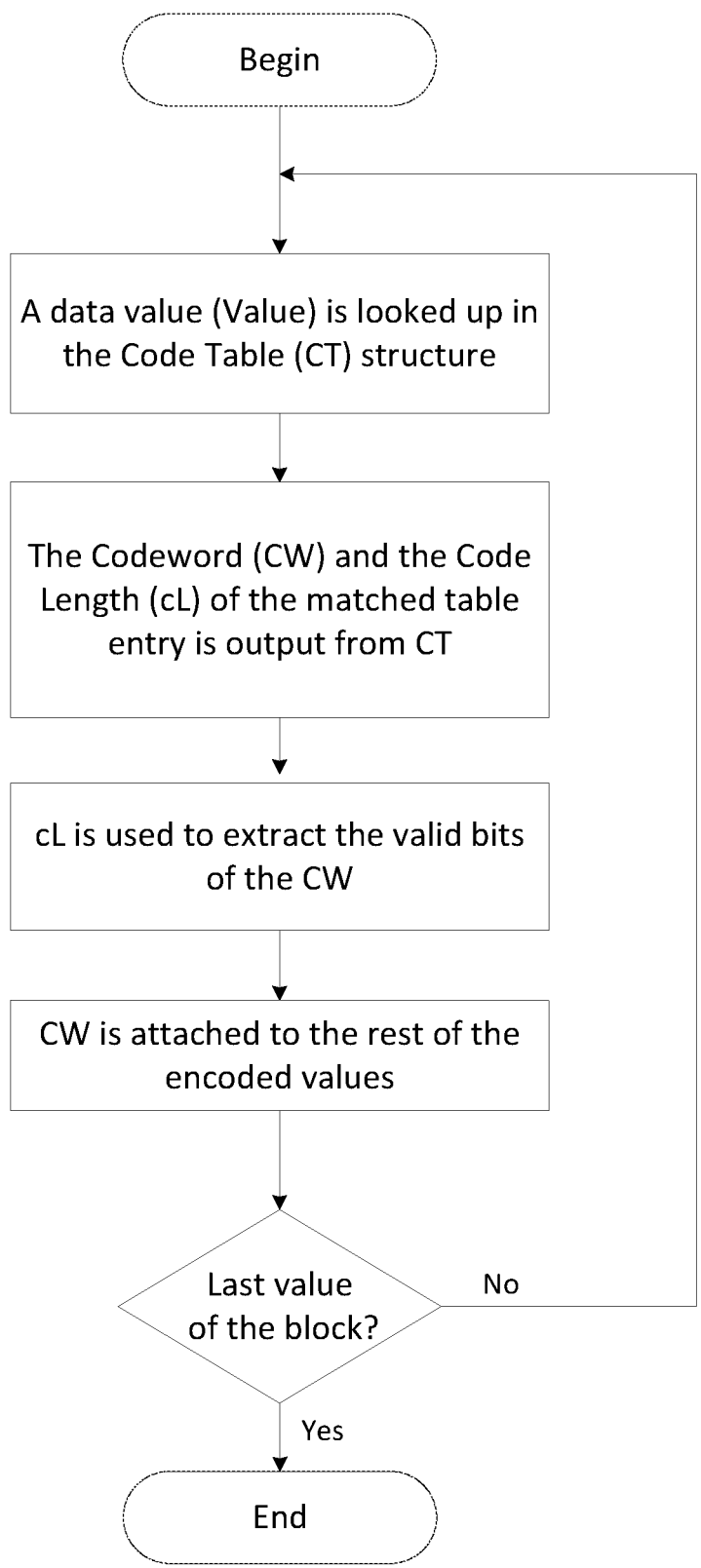
FIG. 25 illustrates an exemplary flow chart of a compression method for compressing a block using variable-length encoding (e.g., Huffman).
Figure 27:
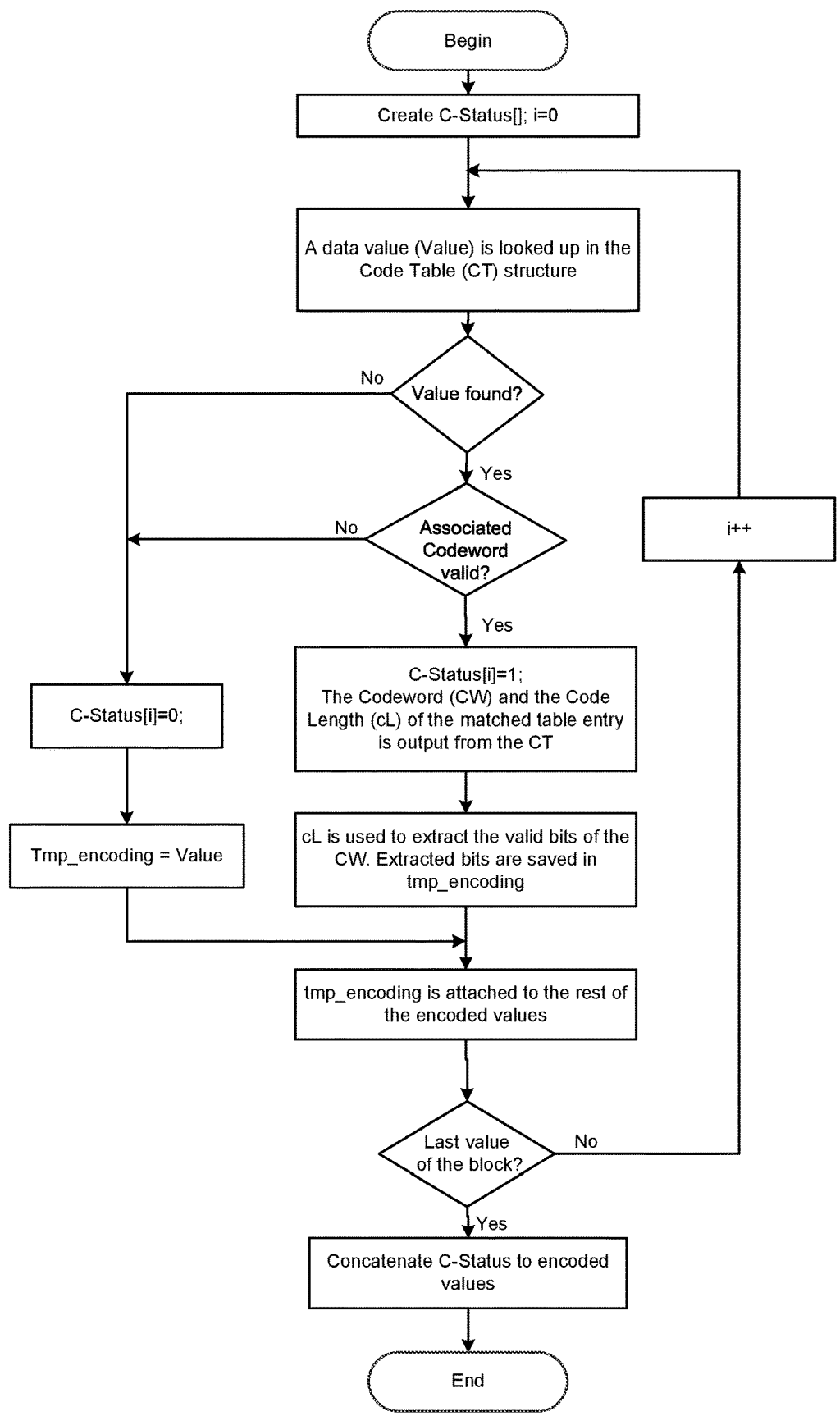
FIG. 27 illustrates an exemplary flow chart of a new method that is built on the top of the compression method of FIG. 25 and is able to compress the block of FIG. 11 by detecting the compressible and uncompressible block data values and generating a mask preceding the variable-length encoded bit sequence, which comprises the compressed and uncompressed values, to indicate the uncompressed values contained in said compressed block.

An exemplary flow chart of a compression method that is built on the basis of the compression method of FIG. 25 and it is able compress the block of FIG. 11, is illustrated in FIG. 27. As in the data compression device of FIG. 14, it detects the compressible and uncompressible block data values by looking them up in the CT and whether they are associated with a valid codeword and encodes this information in the C-Status mask that is saved prior to the encoded values (i.e., variable-length encoded bit sequence).

Figure 26:
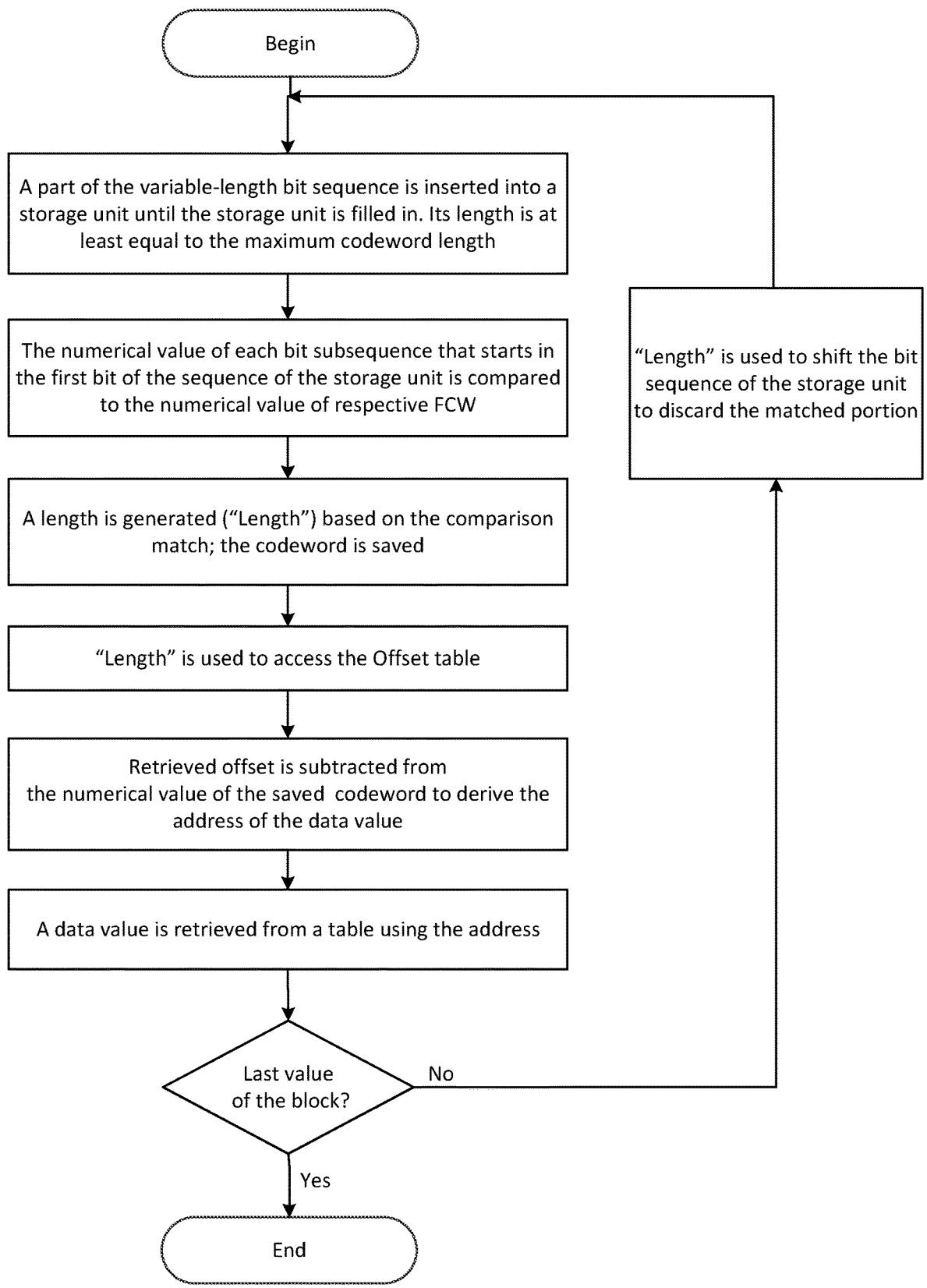
FIG. 26 illustrates an exemplary flow chart of a decompression method for decompressing a compressed block that is compressed using variable-length encoding (e.g., canonical Huffman).
Figure 28:
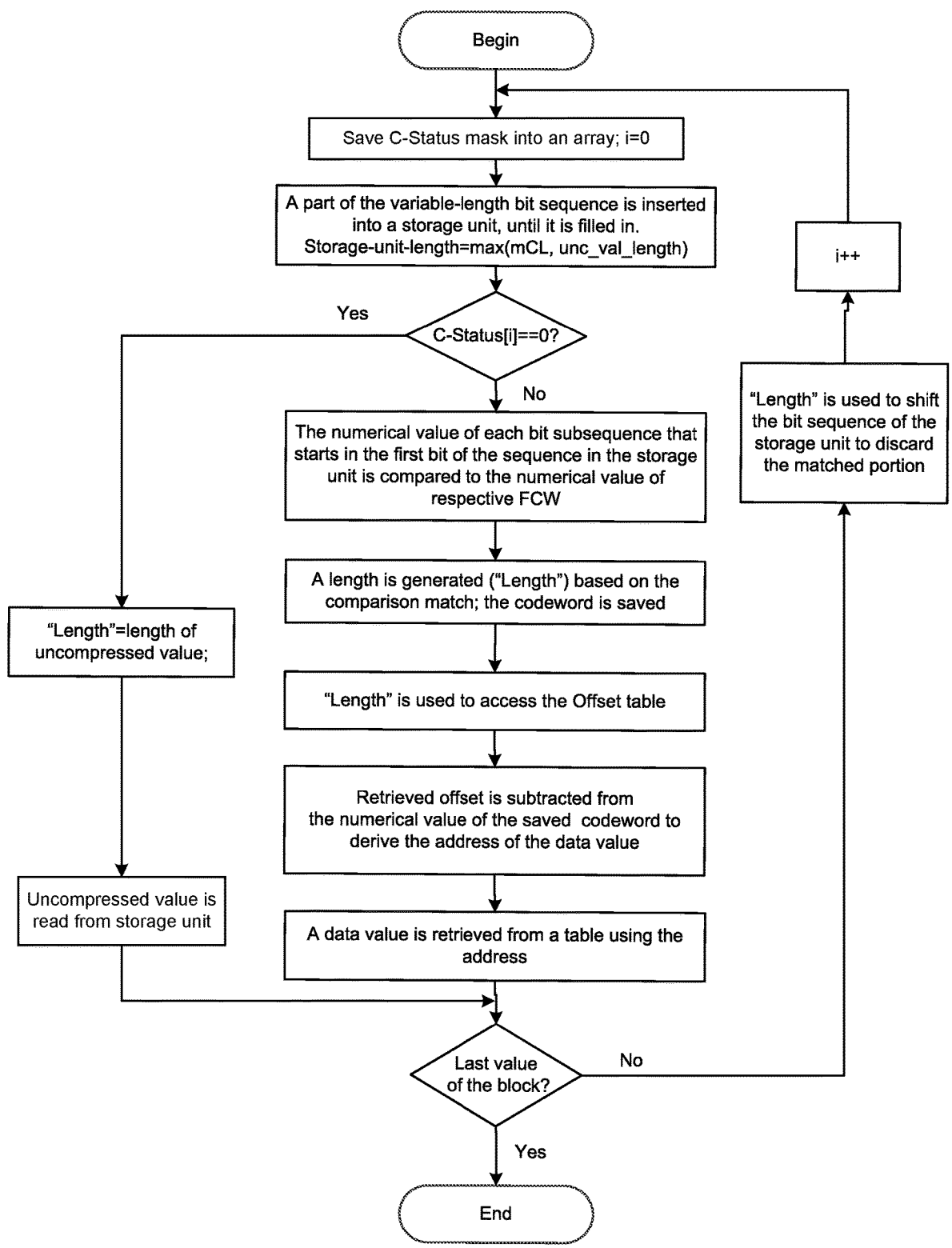
FIG. 28 illustrates an exemplary flow chart of a new method that is built on the top of the method of FIG. 26 to be able to decompress the compressed block of FIG. 11 that comprises a mask preceding the variable-length encoded bit sequence to indicate the uncompressed values.

FIG. 28, on the other hand, illustrates an exemplary flow chart of a decompression method that is built on the basis of the decompression method of FIG. 26 and it is able to decompress the compressed block of FIG. 11, which comprises mixes of uncompressed and compressed values as well as a mask in the beginning of the compressed block that indicates which values are uncompressed and which are not. This decompression method checks in every decompression step the respective C-Status entry. If it is 0, then the current value being decompressed is actually uncompressed and can be read straightforwardly from the storage unit where the bit-sequence (or part of it) of compressed and uncompressed values is saved. The minimum size of the storage unit is defined by the maximum between the length of the maximum variable length codeword (mCL) and the length of the uncompressed value (unc_val_length); however, it is still the length of the maximum variable length codeword that still determines the maximum size of the comparison. The shifting amount ("length") to shift the current bit-sequence to discard the read value is the length of an uncompressed value and it is assigned to the variable "length", as it is shown on the left path of FIG. 28. Otherwise, decompression of this compressed value follows the other path in FIG. 28 and the length of the matched codeword is assigned instead to the "length".

While this first example solution of using a fixed-size mask prior to the variable-length compressed block of data values certainly may have its benefits, it may nevertheless have a disadvantage in that it may reduce the compression efficiency. This is so, since it always adds a fixed number of bits. If no uncompressed values occur in the compressed block, the mask is in fact not needed. So, the fixed-size mask will inevitably add area overhead if the number of uncompressed values is small.

Figure 12:
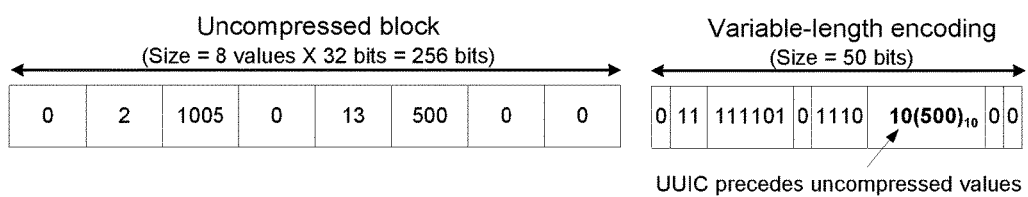
FIG. 12 illustrates on the left an uncompressed block and on the right the same block in compressed form in a second alternative way, comprising a mix of compressed and uncompressed values where each uncompressed value is preceded by a unique variable length (e.g., Huffman) codeword that corresponds only to all uncompressed values.

An alternative example of the compressed block of FIG. 11 is depicted in FIG. 12. In this example, a mask can be entirely avoided, if instead a unique special-meaning codeword precedes each uncompressed value (i.e., the second solution to realize a mix of compressed and uncompressed data values within a block of data, given that the sequence of data values remains unchanged as in the original uncompressed block). Hence, the compression efficiency may be improved. This unique codeword can be generated together with the rest of variable-length encodings (for example, Huffman encodings (codewords. e.g. in the form of the codewords (CW) 1625 in the Code Table (CT) 1622 of the Variable-length Encoding Unit 1620 in FIG. 16)) at the time of code generation, by calculating or estimating the frequency of occurrence of all these values that did not appear in the value-frequency table. For example, this can be calculated by incrementing an extra counter when one or a plurality of values is not captured by such value-frequency table or is evicted from such table to create space for other more frequent values. Other possible solutions to this can be realized by someone skilled in the art. Distinguishing the uncompressed from compressed values within a compressed block in this alternative way of also using their frequency of occurrence can lead to a more efficient solution in terms of compression efficiency in comparison to the previous embodiment where a fixed-size mask is used: The more the values that are not captured by the value-frequency tracker, thus the more the values that will be left uncompressed in comparison to the total number of valued occurred, the narrower the unique codeword attached to the uncompressed values. On the other hand, the less frequent the number of uncompressed values occurs, the wider the unique codeword attached to each uncompressed value. Hence, the frequency of occurrence of all data values that did not appear in the value-frequency table at the time of code generation in comparison to the total number of occurring data values will affect the width of the unique codeword. This unique codeword attached to all uncompressed values is referred to from now on as "Unique Uncompressed Identifier Codeword" (UUIC).

Figure 16:
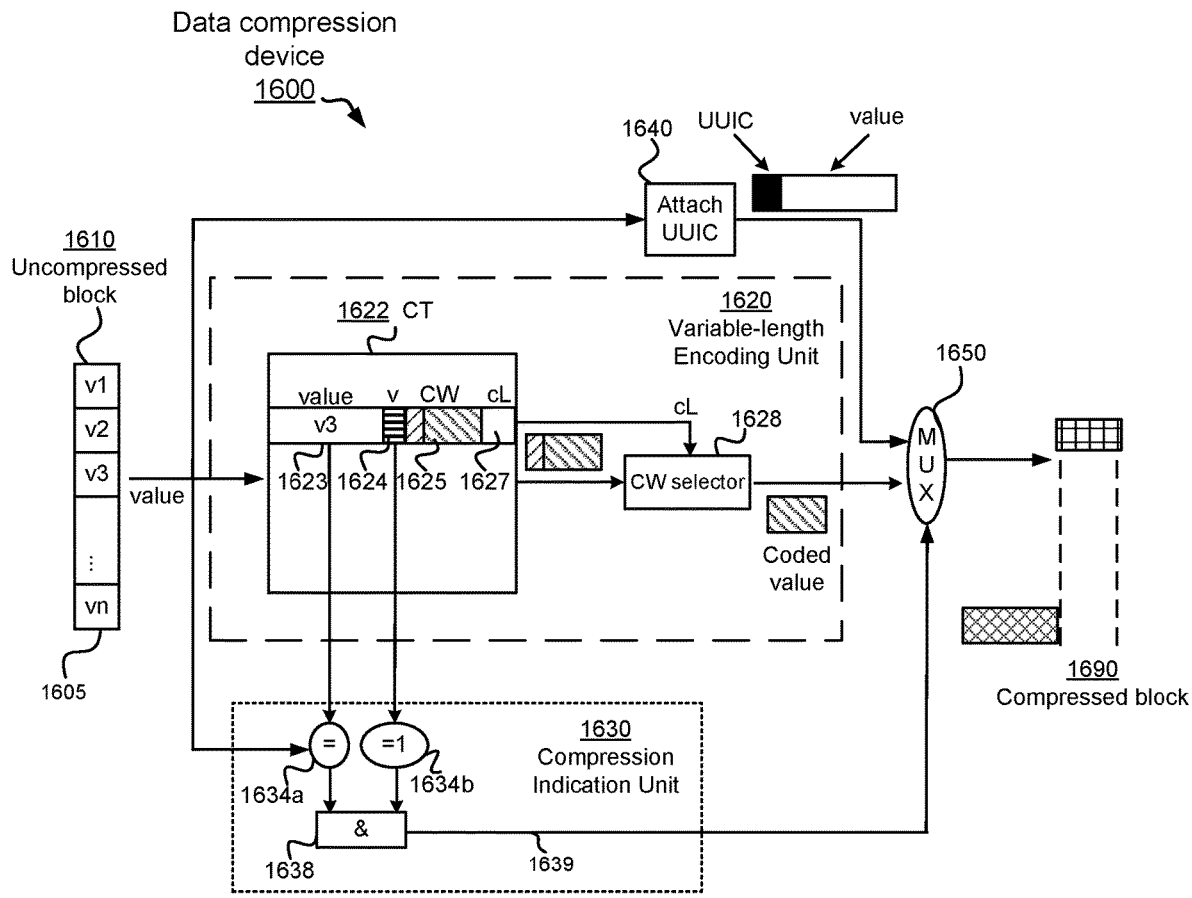
FIG. 16 illustrates a data compression device, based on the compressor of FIG. 9 but modified and extended to be able to compress the block of FIG. 12 by detecting the compressible and uncompressible block data values and encoding the uncompressed block data values within the variable-length encoded bit sequence, which comprises compressed and uncompressed values, with a unique codeword that corresponds only to uncompressed values attached prior to each uncompressed value.

A block diagram of an example data compression device 1600 that is able to form said compressed data block of FIG. 12 is depicted in FIG. 16. It comprises a unit 1605, which can be a storage unit or an extractor of data value out from the uncompressed data block 1610 as it is used by the aforementioned data compression device embodiments, a compressor in the form of a Variable-length Encoding Unit 1620, a detector in the form of a Compression Indication Unit 1630, and a compressed data block generator comprised by a UUIC attachment unit 1640 and other logic 1650. The units 1620 and 1630 are similar to the Variable-length Encoding Unit 1420 and the Compression Indication Unit 1430 of the data compression device 1400 of FIG. 14. This data compression device 1600 works as follows. A data value is extracted from the uncompressed data block 1610 and checked by the Compression Indication Unit 1630 whether it can be compressed or not using the Variable-length Encoding Unit 1620. If not (i.e., the data value will be saved uncompressed), the UUIC is attached by the unit 1640 in front of the data value, otherwise the data value is encoded using the unit 1620. The unit 1640 contains also a storage unit (not shown in FIG. 16 for clarity) where it keeps the UUIC. This storage unit is updated when a new UUIC is generated (e.g., when a new Huffman encoding is generated). The right selection is made by a selector 1650, which is controlled by a detection result 1639 of the Compression Indication Unit 1630, and is further attached to the rest of compressed data values that will form in the end the compressed data block 1690. As has already been explain above, the data compression device 1600 may improve the compression efficiency compared to the data compression device 1400 in FIG. 14. A second advantage of the data compression device 1600 over the data compression device 1400 is that the concatenator 1460 can be dispensed with. Hence, no separate hardware for concatenating the metadata (cf the C-Status Mask in FIG. 14) to the compressed data block will be needed, and the data compression device 1600 may thus offer further improvements in terms of reduced hardware cost and increased compression speed.

Hence, the compressed data block generator 1640-1650 is configured to generate the aforementioned metadata as a unique special-meaning codeword, UUIC, indicative of detected data values of the uncompressed data block 1610 that cannot be compressed by said compressor 1620. Moreover, the compressed data block generator 1640-1650 is configured to attach the unique special-meaning codeword, UUIC, to each uncompressed data value when generating the compressed data block 1690.

Moreover, as is clear from the above, the compressed data block generator 1640-1650 is configured to generate the compressed data block 1690 by iteratively building a variable-length encoded bit sequence by adding a compressed data value in the form of the variable-length codeword, or an uncompressed data value with the attached unique special-meaning codeword, UUIC, depending on the detection result 1639 of the detector 1630 in the order of appearance of the data values in the uncompressed data block 1610.

Figure 17A:
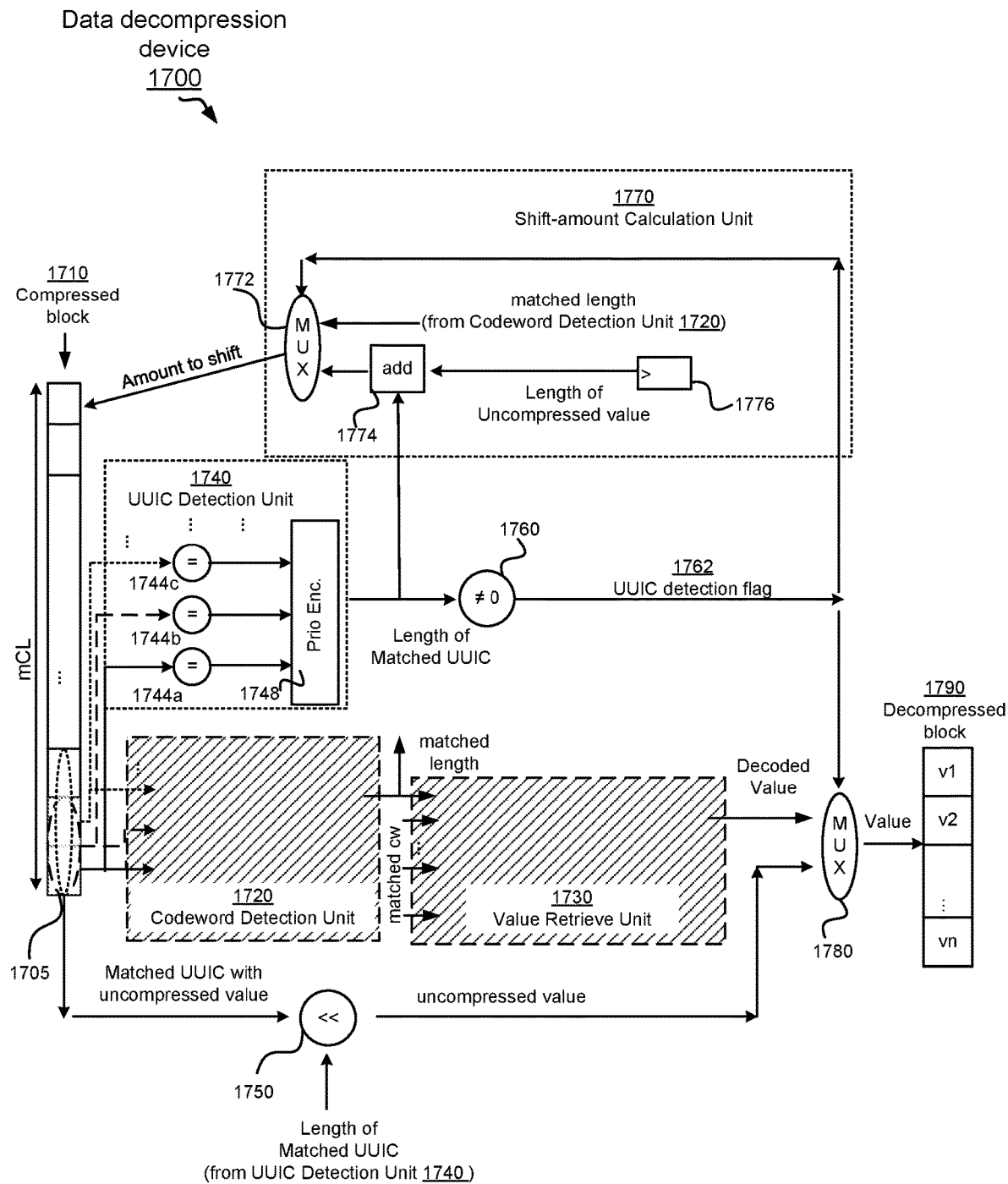
FIG. 17a shows a data decompression device, based on the decompressor of FIG. 10 but modified and extended to be able to decompress the compressed block of FIG. 12 that comprises compressed and uncompressed values where each uncompressed value is preceded by a unique codeword that corresponds only to uncompressed values.

A block diagram of an example data decompression device 1700 that is able to decompress said compressed data block of FIG. 12 is depicted in FIG. 17a. The data decompression device 1700 comprises a storage unit 1705, which saves part of the compressed data block 1710 (the part size is at least the maximum of the total length of the UUIC attached to an uncompressed value and the maximum codeword length), a Codeword Detection Unit 1720 (similar to the Codeword Detection Unit 1020 of the decompressor 1000 of FIG. 10), a Value Retrieve Unit 1730 (similar to the Value Retrieve Unit 1030 of the decompressor 1000 of FIG. 10), a UUIC Detection Unit 1740, a Shift-amount Calculation Unit 1770, a shifting unit 1750, a comparator unit 1760 and a selector 1780. The Codeword Detection Unit 1720 and the Value Retrieve Unit 1730 thus form a decompressor, while units 1740-1780 form a decompressed data block generator.

In every data value decompression, the UUIC Detection Unit 1740 takes as input one or a plurality of bit-subsequences of all possible widths starting at the first bit of the bit-sequence that is saved in the unit 1705. Each said width can be 1 bit, 2 bits, 3 bits, etc., up to a maximum width that equals to the maximum UUIC width, which can be bounded to a specific value similarly to the mCL at design, compile, configuration or run time depending on the chosen implementation of such data decompression device (e.g., in software or in hardware), as mentioned in paragraph [0015]. The Codeword Detection Unit 1720 uses the same bit-subsequences or a superset of them. The UUIC Detection Unit 1740 tries to detect an uncompressed data value by matching one of those bit-sequences to the candidate UUIC using the comparators 1744a, 1744b, 1744c, etc, and generating the "Length of matched UUIC" using the priority encoder 1748. Although only one UUIC of a specific length exists for each generated and used version of Huffman encoding, its length is not known in advance; therefore each bit subsequence needs to be compared in the equality comparators 1744a, 1744b, 1744c. However, only one comparison will be valid. The rest are invalidated by using respective invalid signals that are also updated when a new coding is generated (not shown in FIG. 17a for reasons of clarity).

The "Length of matched UUIC", which is output by the unit 1740, indicates whether a UUIC is detected or not, using the comparator 1760. The output of this comparator is the "UUIC detection flag". The "Length of matched UUIC" is used: a) in the Shift-amount Calculation Unit 1770, where it is added (using the adder 1774) to the length of the uncompressed value (i.e., of fixed-length and typically determined based on the used value granularity during code generation, e.g., 32 bits if the symbol granularity is 4 bytes) stored in the storage unit (e.g., flip-flop) 1776; and b) in the shift unit 1750, where the UUIC is removed out of the bit sequence "Matched UUIC with uncompressed value" (extracted from the unit 1710) so that only the uncompressed data value remains. The "UUIC detection flag" is used as a control signal 1762 to the selectors 1772 and 1780. The selector 1772 of the Shift-amount Calculation Unit 1770 determines the shifting amount of the bit sequence stored in 1710 so that the matched part (either the uncompressed data value followed by the UUIC or a codeword detected by the unit 1720) is removed and the empty part is filled in by the next bits of the compressed sequence. On the other hand, the selector 1780 selects between the uncompressed data value and the decoded value output by the Value Retrieve Unit 1730. The selected value is concatenated with the rest of decompressed data values. Decompression continues until all the data values of the compressed data block 1710 are decompressed and form the decompressed data block 1790 of data values v1 . . . vn.

Hence, the decompressed data block generator 1740-1780 is configured to detect a unique special-meaning codeword, UUIC, being comprised in the compressed data block 1710 and generate the resulting control signal 1762. The decompressed data block generator 1740-1780 is also configured to remove the detected unique special-meaning codeword from an associated uncompressed data value to which the unique special-meaning codeword was attached.

Moreover, the decompressed data block generator 1740-1780 is configured to generate the decompressed data block 1790 by controlling, for each data value in the compressed data block 1710, the selector 1780 to select a decompressed data value from the decompressor 1720, 1730 or an uncompressed data value for which the detected unique special-meaning codeword has been removed, based on the control signal 1762.

Figure 17B:
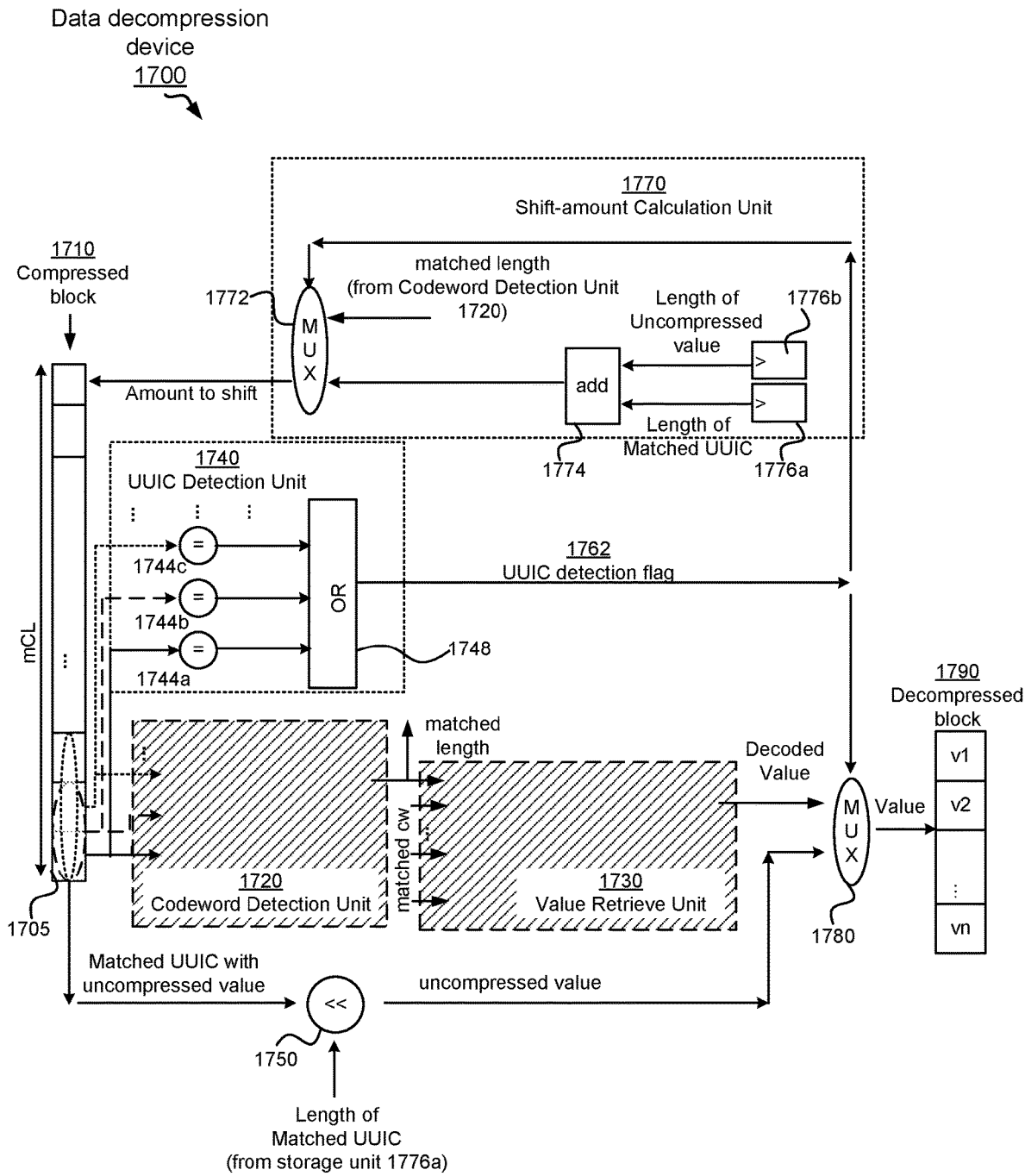

A block diagram of an alternative embodiment of the example data decompression device of FIG. 17a is depicted in FIG. 17b. In this data decompression device, the comparator 1760 is omitted, as the UUIC Detection Unit 1740 is implemented using the comparators 1744a-c and an OR gate 1748 instead of the priority encoder 1748 of FIG. 17a. The UUIC Detection Unit 1740 generates straightforwardly, as a result, the UUIC detection flag, instead of the "Length of the matched UUIC". Instead, the "Length of the matched UUIC" is output by a storage unit 1776a, e.g., a flip-flop that is updated every time a new Huffman encoding is generated so that it corresponds to the right length of the UUIC attached to uncompressed values. The rest of units and logic are similar to the ones in the data decompression device of FIG. 17a. Other alternative implementations of this data decompression device embodiment can be realized by someone skilled in the art.

Figure 29:
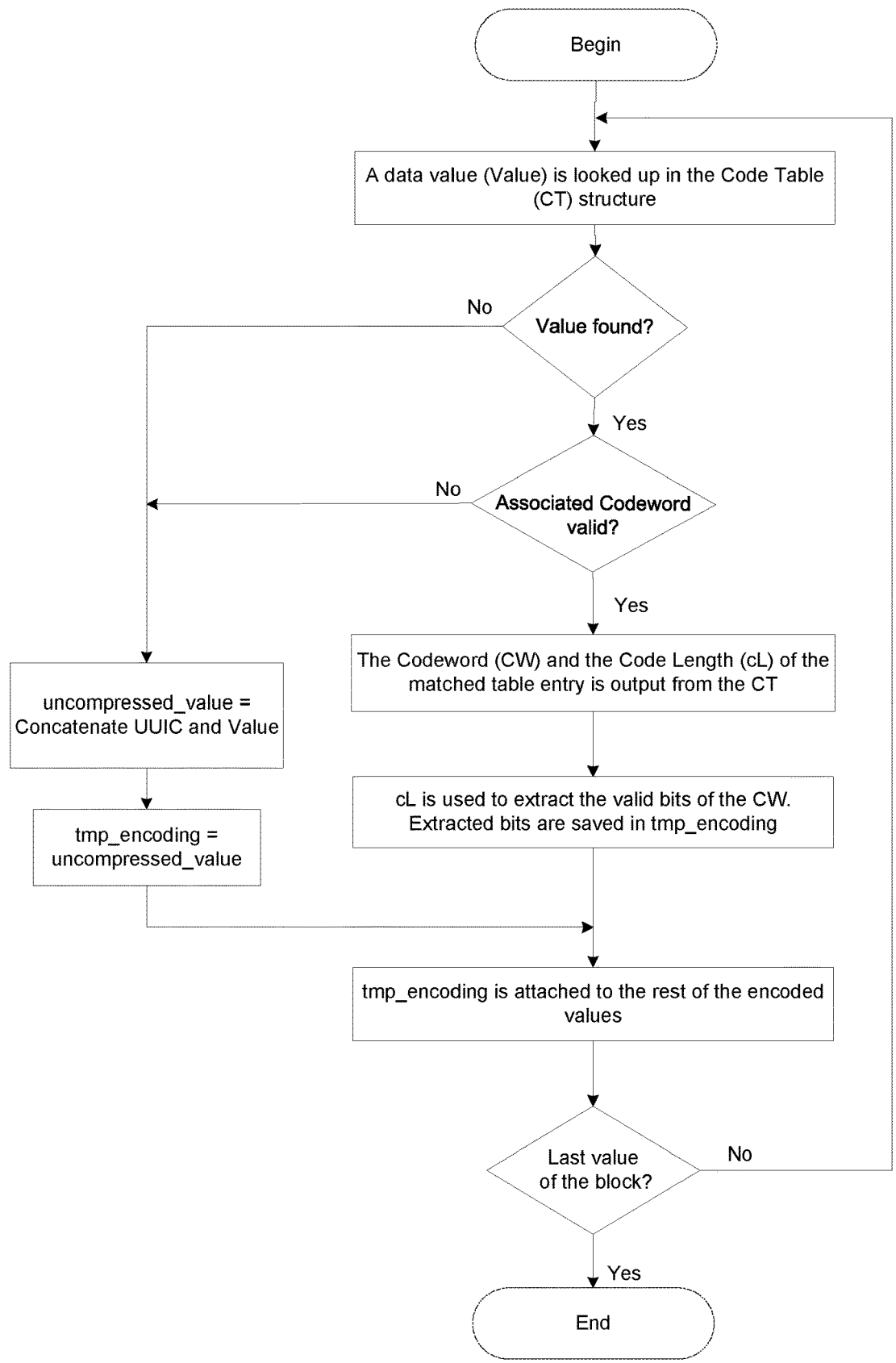
FIG. 29 illustrates an exemplary flow chart of a new method that is built on the top of the compression method of FIG. 25 to be able to compress the block of FIG. 12 by detecting the compressible and uncompressible block data values and encoding the uncompressed block data values within the variable-length encoded bit sequence, which comprises compressed and uncompressed values, with a unique codeword that corresponds only to uncompressed values attached prior each uncompressed value.

An exemplary flow chart of a compression method that is built on the basis of the compression method of FIG. 25 and it is able to compress the block of FIG. 12, is illustrated in FIG. 29. Said compression method uses the same detection method for detecting the compressible and uncompressible data values of the block, as the compression method of FIG. 27. However, it encodes the block's uncompressed data values within the variable-length encoded bit sequence, which comprises compressed and uncompressed values, by attaching the UUIC prior the uncompressed value as is also described in the data compression device of FIG. 16.

Figure 30:
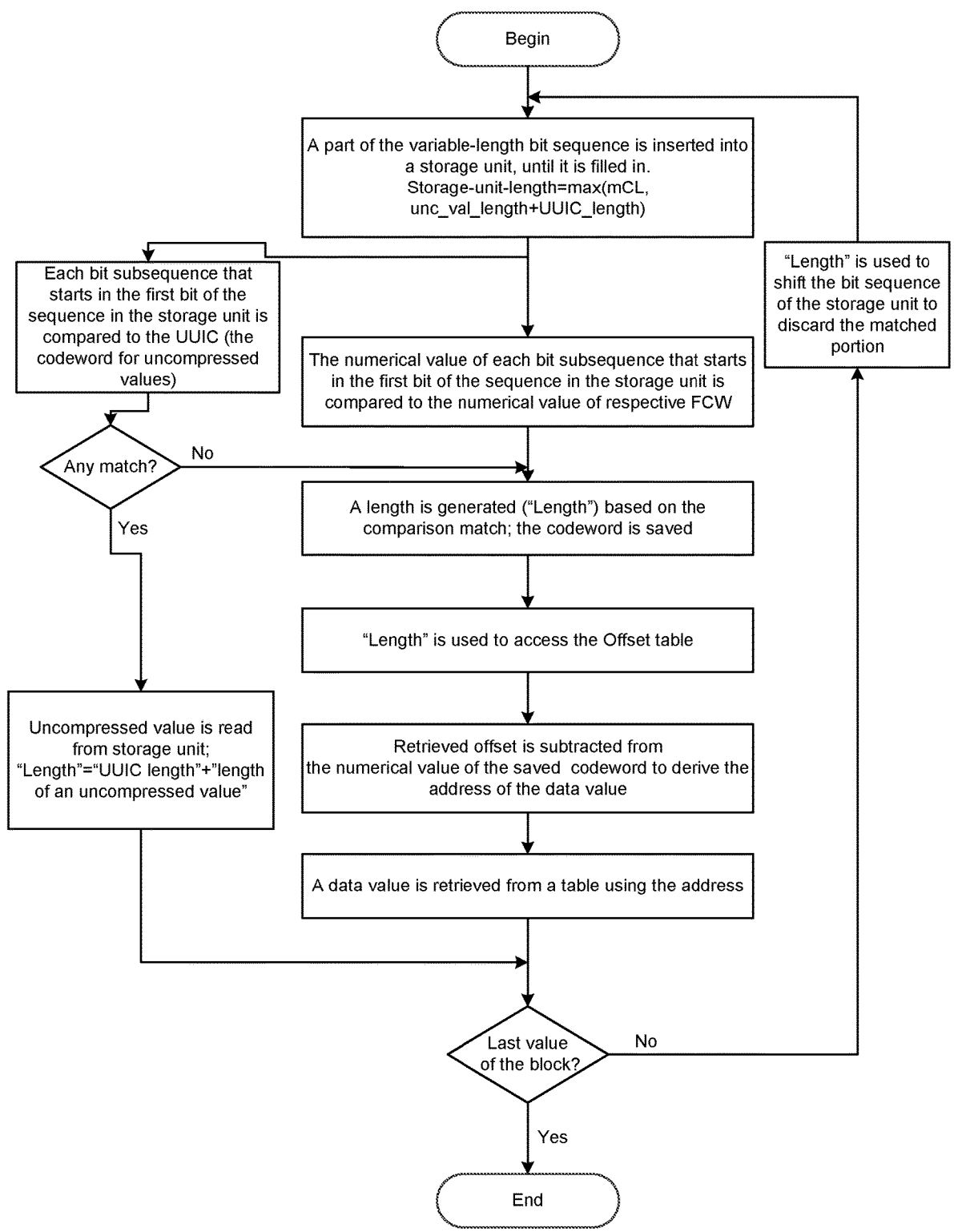
FIG. 30 illustrates an exemplary flow chart of a new method that is built on the top of the method of FIG. 26 to be able to decompress the compressed block of FIG. 12 that comprises compressed and uncompressed values where each uncompressed value is preceded by a unique codeword that corresponds only to uncompressed values.

An exemplary flow chart of a decompression method that is built on the top of the method of FIG. 26 and it is able to decompress the compressed block of FIG. 12, which comprises compressed and uncompressed values where each uncompressed value is preceded by the UUIC, is illustrated in FIG. 30. The bit-subsequences aligned in the first bit position of the bit-sequence saved in a storage unit, which are numerically compared to the first codeword (FCW), are also compared to the unique codeword that is attached to the uncompressed values (UUIC). If said latter comparison yields a match, the uncompressed value can be read straightforwardly from the storage unit while the shifting amount ("length") of the current bit-sequence in order to discard the read value, is the UUIC length plus the length of an uncompressed value. Otherwise, decompression of the compressed value follows the other path in FIG. 30 and the length of the matched codeword is assigned to the "length". The minimum size of the storage unit is defined by the maximum between the length of the maximum variable length codeword (mCL) and the aggregated length of the uncompressed value (unc_val_length) and the UUIC_length.

Figure 13:
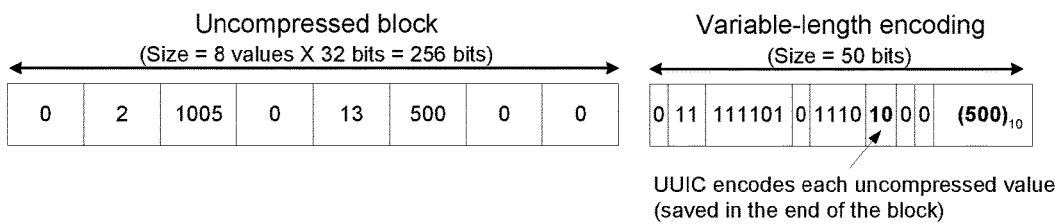
FIG. 13 illustrates on the left an uncompressed block and on the right the same block in compressed form in a third alternative way, comprising a mix of compressed and uncompressed values where each uncompressed value in the original sequence of data values in the block is replaced by the unique variable-length (e.g., Huffman) codeword that corresponds only to all uncompressed values, while the actual uncompressed values are saved in reverse appearance order in the end of the block (i.e., the last saved uncompressed value is the first appearing uncompressed value in the original order of data values in the block).

The shifting amount of the compressed bit-sequence, which is kept in the storage unit 1010 (FIG. 10) or 1710 (FIG. 17), is of arbitrary size after matching a codeword (either regular codeword by the Codeword Detection Unit 1020 (or 1720) or the UUIC by the UUIC Detection Unit 1740). The arbitrary shifting amount typically adds complexity to the shifter implementation. In addition, the maximum shifting amount can be large due to the sum of the UUIC length and the fixed-size length of the uncompressed value (after UUIC detection). One approach to reduce the shifting cost and possibly accelerate decompression is to migrate the uncompressed values to the end of the compressed block, and save them in reverse order of the order of appearance in the original uncompressed block, during compression. FIG. 13 illustrates yet another embodiment of the compressed block compressed in said new approach (i.e., the third solution to realize a mix of compressed and uncompressed data values within a block of data by rearranging the original sequence of data values when the compressed block is formed). On the right of FIG. 13, the uncompressed value 500 has been moved to the end of the compressed block; in order to be able to reconstruct the original order of values when decompressing the block, the UUIC which was previously attached in front of the uncompressed values, it now encodes them. Hence, the UUIC replaces the value 500 in the original value order so that when it is detected by the UUIC Detection Unit, the uncompressed value can be retrieved by the end of the block.

Figure 18:
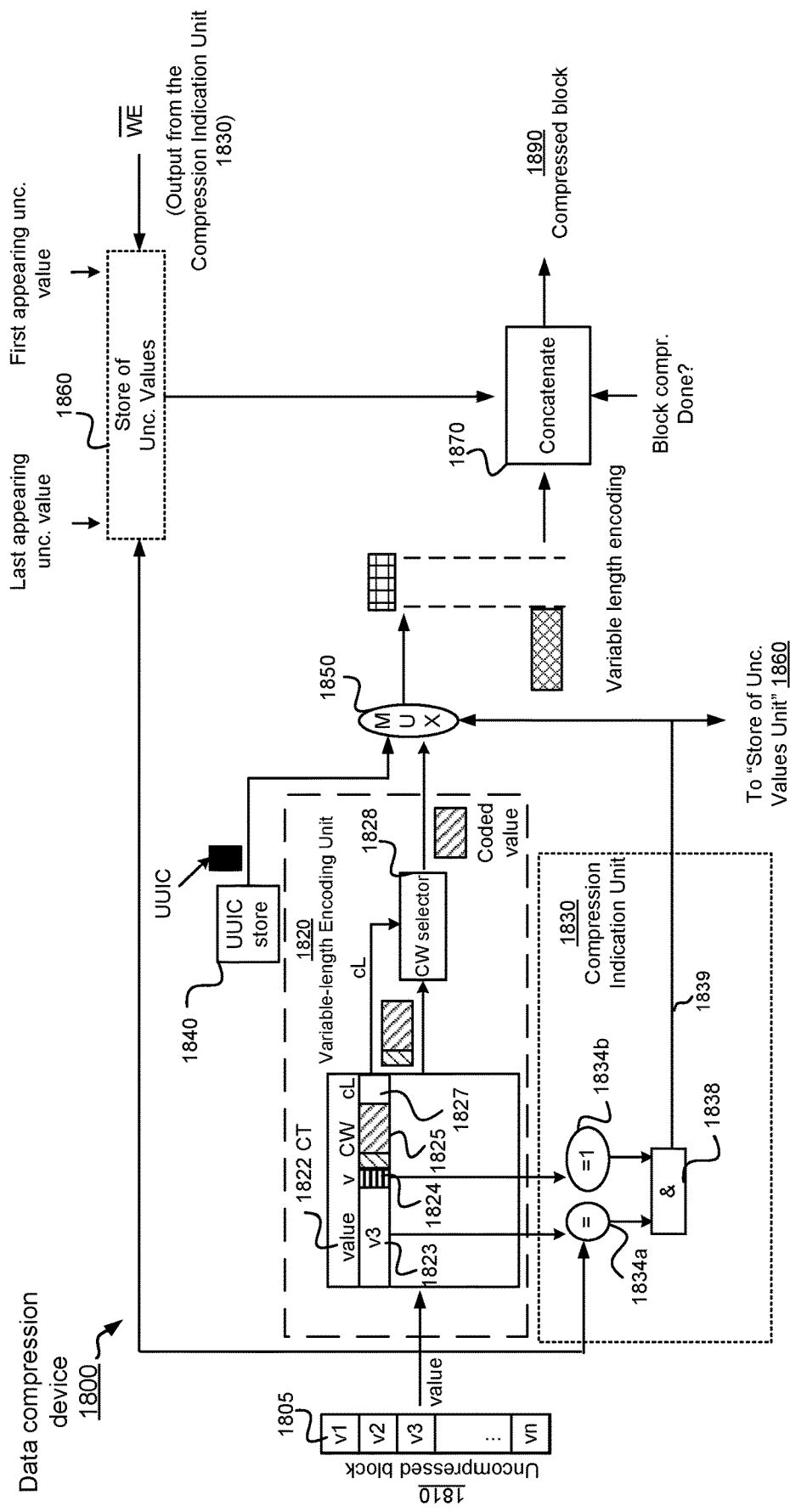
FIG. 18 illustrates a data compression device, based on the compressor of FIG. 9 but modified and extended to be able to compress the block of FIG. 13 by detecting the compressible and uncompressible block data values, replacing the uncompressed block data values within the variable-length encoded bit sequence, which comprises compressed and uncompressed values, with a unique codeword that corresponds only to all uncompressed values and placing the actual uncompressed values in the end of the compressed block in reverse appearing order (last appearing value to first appearing value).

A block diagram of an example data compression device 1800 that is able to form said compressed data block of FIG. 13 is depicted in FIG. 18. It comprises a unit 1805, which can be a storage unit or an extractor of data value out from the uncompressed data block 1810 as it is used by the aforementioned data compression device embodiments, a compressor in the form of a Variable-length Encoding Unit 1820, a detector in the form of a Compression Indication Unit 1830, and a compressed data block generator comprised by a UUIC storage unit 1840, a selector 1850, a storage unit 1860 for uncompressed data values and a concatenation unit 1870. The units 1820 and 1830 are similar to the Variable-length Encoding Unit and the Compression Indication Unit respectively of the aforementioned data compression devices 1400 and 1600. However, when a data value is identified to not be compressible by the Compression Indication Unit 1830, the UUIC that is read from the UUIC store 1840 is selected by the selector 1850 and is attached to the variable-length encoded bit sequence. The data value, which remains uncompressed, is saved instead in the storage unit 1860 for Uncompressed Values. This storage unit keeps the uncompressed data values in reverse order from the order of appearance of the data values in the uncompressed data block 1810 during compression. For example, the first appearing uncompressed data value (of 32 bits assuming a value granularity of 4 bytes) is saved in the last position of the storage unit 1860 (rightmost position in FIG. 18). The write enable (WE) of the storage unit 1860 is connected to the output of the Compression Indication Unit 1830. When all the data values have been processed, the sequence of uncompressed data values (if it contains valid uncompressed data values) is attached to the end of the variable-length encoded bit sequence and form together the compressed data block 1890.

Hence, just like the compressed data block generator 1640-1650 described above with reference to FIG. 16, the compressed data block generator 1840-1870 in FIG. 18 is configured to generate said metadata as a unique special-meaning codeword, UUIC, indicative of detected data values of the uncompressed data block 1810 that cannot be compressed by the compressor 1820. Moreover, the compressed data block generator 1840-1870 is configured, for all detected data values of the uncompressed data block 1810 that cannot be compressed by the compressor 1820, to include the unique special-meaning codeword but not the respective detected data values in the generated compressed data block 1890 in the order of appearance of the data values in the uncompressed data block 1810. The compressed data block generator 1840-1870 is also configured to attach the detected data values of the uncompressed data block 1810 that cannot be compressed by the compressor 1820 at an end (i.e. a trailing end or a leading end) of the generated compressed data block 1890, in a reverse order compared to the order in which the detected data values appeared in the uncompressed data block 1810.

Moreover, as is clear from the above, the compressed data block generator 1840-1870 is configured to generate the compressed data block 1890) by iteratively building a variable-length encoded bit sequence by adding each compressed data value in the form of the variable-length codeword from the compressor 1820 in the order of appearance of the data values in the uncompressed data block 1810. Each time the detector 1830 detects a data value in the uncompressed data block 1810 that cannot be compressed by the compressor 1820, the unique special-meaning codeword, UUIC, is added to the variable-length encoded bit sequence, whereas the detected data value is saved in the storage unit 1860. The detected data values are saved in the storage unit 1860 in a reverse order compared to the order of appearance of the data values in the uncompressed data block 1810. When all data values of the uncompressed data block 1810 have been processed, the compressed data block 1890 is generated by having the concatenator 1870 concatenating the variable-length encoded bit sequence and the saved data values in the storage unit 1860.

Figure 19:
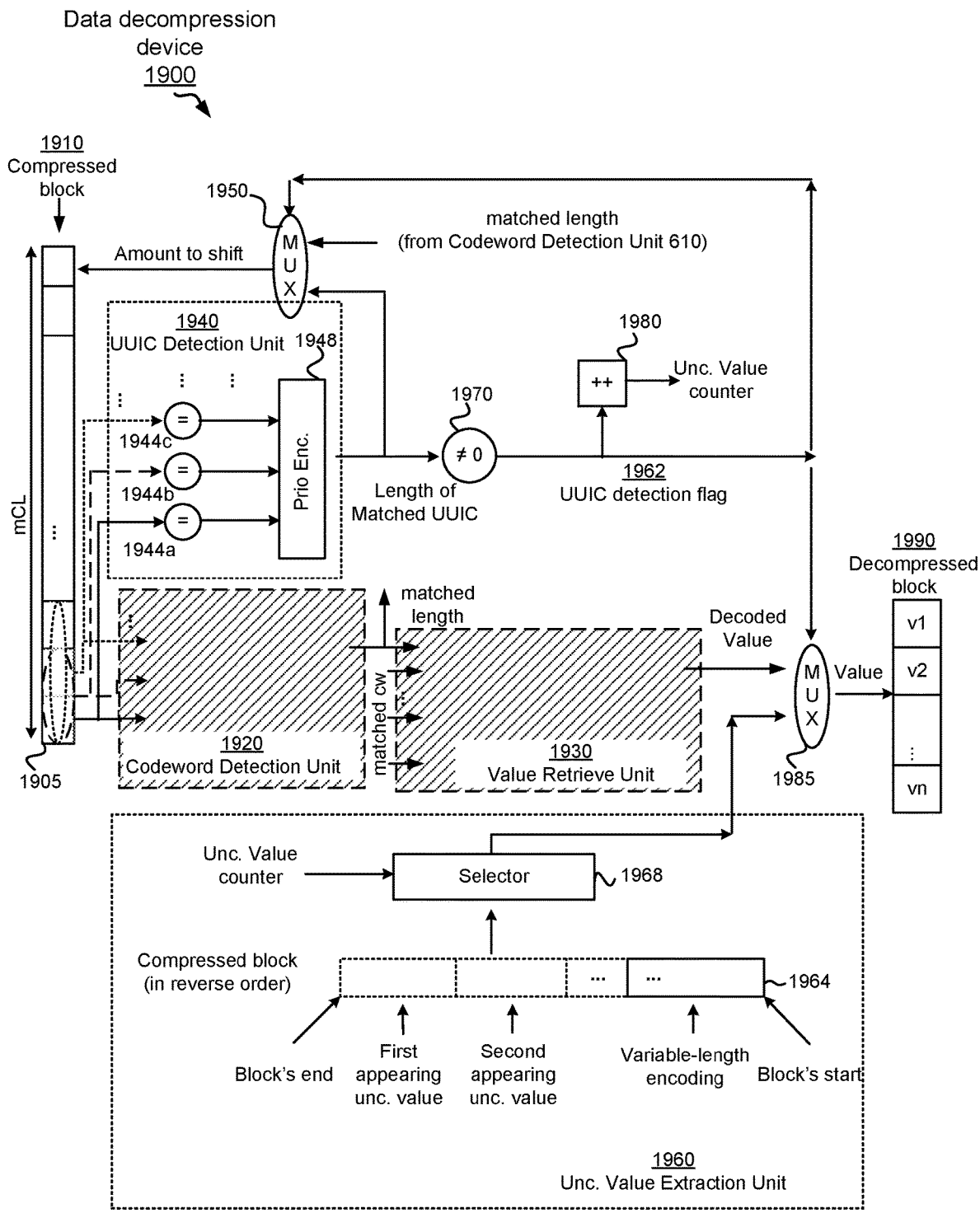
FIG. 19 shows a data decompression device, based on the decompressor of FIG. 10 but modified and extended to be able to decompress the compressed block of FIG. 13 that contains a mix of compressed and uncompressed values where each uncompressed value is replaced by a unique codeword that corresponds only to all uncompressed values, while the uncompressed values are saved in reverse appearing order in the end of the block.

A block diagram of an example embodiment of the data decompression device 1900 that is able to decompress the compressed block of FIG. 13 is depicted in FIG. 19. The data decompression device 1900 comprises a storage unit 1905, which saves part of the compressed data block (the size of the storage unit 1905 is at least the maximum of the total length of the UUIC and the maximum codeword length), a Codeword Detection Unit 1920 (similar to the Codeword Detection Unit 1020 of the decompressor 1000 of FIG. 10), a Value Retrieve Unit 1930 (similar to the Value Retrieve Unit 1030 of the decompressor 1000 of FIG. 10), a UUIC Detection Unit 1940 (similar to the UUIC Detection Unit 1740 of the data decompression device 1700 of FIG. 17a), an Uncompressed Value Extraction Unit 1960, and extra logic. The extra logic comprises the comparator unit 1970, the arithmetic unit 1980 and the selectors 1950 and 1985. The Codeword Detection Unit 1920 and the Value Retrieve Unit 1930 thus form a decompressor, while units 1940-1985 form a decompressed data block generator.

The Uncompressed Value Extraction Unit 1960 comprises a selector unit 1968 and a storage unit 1964, which keeps the compressed block in reverse order (block end to block beginning) to the order in which the uncompressed data values are placed, by the data compression device of FIG. 18, in the end of the data block in reverse order from the order of appearance. Based on the currently detected uncompressed value sequence number, which is measured by the arithmetic unit 1980 (e.g., an incrementor) for every non-zero (verified by the comparator unit 1970) "Length of Matched UUIC" that is output from the UUIC Detection Unit 1940, the Uncompressed Value Extraction Unit 1960 selects the respective uncompressed data value from the storage unit 1964 and sends it to the rest of decompressed data values through the selector 1985. This way, the uncompressed data value is not read anymore from the storage unit 1910, as in the data decompression device 1700 of FIG. 17 or 1500 of FIG. 15, while the maximum shifting amount of the compressed bit-sequence is reduced to the maximum of the UUIC length and the maximum codeword length. If there are no uncompressed data values in the end of the compressed data block, the output of the Uncompressed Value Extraction Unit 1960 will not be selected as the UUIC will not be detected.

Hence, the decompressed data block generator 1940-1985 is configured to detect a unique special-meaning codeword, UUIC, being comprised in the compressed data block 1910, and generate a resulting control signal 1962. The decompressed data block generator 1940-1985 is also configured to generate the decompressed data block 1990 by controlling—for each data value of the compressed data block 1910 and based on the control signal 1962—the selector 1985 to select a decompressed data value from the decompressor 1920, 1930 in the order of appearance of the compressed data values in the compressed data block 1910, or an uncompressed data value from the compressed data block 1910 in a reverse order compared to the order in which the uncompressed data values appeared in the compressed data block 1910.

Moreover, the decompressed data block generator 1940-1985 is configured to store a copy of at least a part of the compressed data block 1910 in reverse order in the storage unit 1964, wherein the trailing end of the compressed data block is stored at the beginning of the storage unit 1964. The decompressed data block generator 1940-1985 is also configured to increment the uncompressed data values counter 1980 each time the unique special-meaning codeword, UUIC, is detected as comprised in the compressed data block 1910, and to use the uncompressed data values counter 1980 as a pointer to a memory position in the storage unit 1964 to provide an uncompressed data value to the selector 1985.

Figure 31:
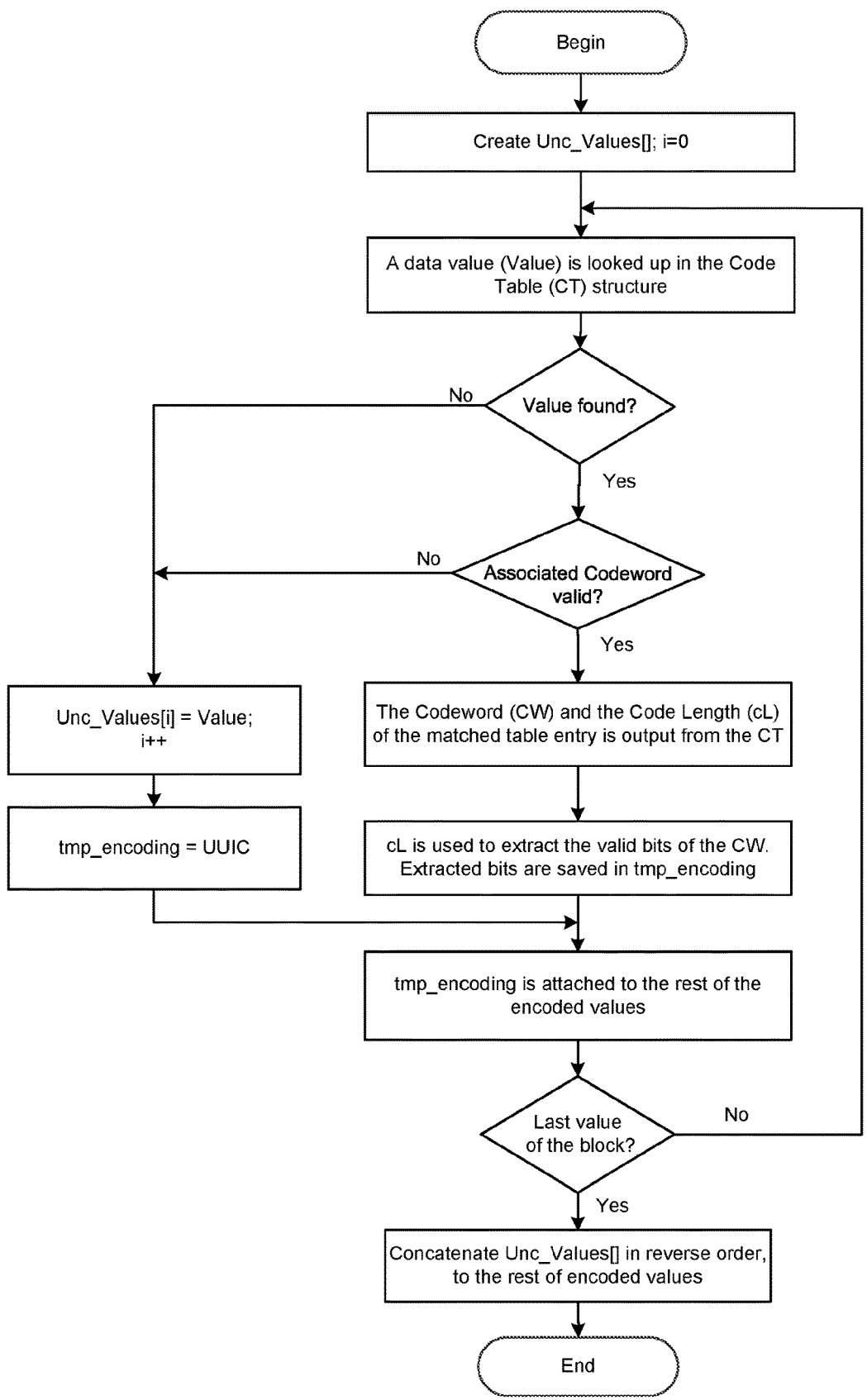
FIG. 31 illustrates an exemplary flow chart of a new method that is built on the top of the compression method of FIG. 25 to be able to compress the block of FIG. 13 by detecting the compressible and uncompressible block data values and encoding the uncompressed block data values within the variable-length encoded bit sequence, which comprises compressed and uncompressed values, with a unique codeword that corresponds only to all uncompressed values and placing the actual uncompressed values in the end of the compressed block in reverse appearing order (last appearing value to first appearing value).

An exemplary flow chart of a compression method that is built on the basis of the compression method of FIG. 25 and it is able to compress the block of FIG. 13, is illustrated in FIG. 31. Said compression method uses the same detection method for detecting the compressible and uncompressible data values of the block, as the compression method of FIG. 27. However, it encodes the block's uncompressed data values in the original data value order within the variable-length encoded bit sequence, which comprises compressed and uncompressed values, with the UUIC and places the actual uncompressed values in the end of the compressed block in reverse appearing order (last appearing value to first appearing value).

Figure 32:
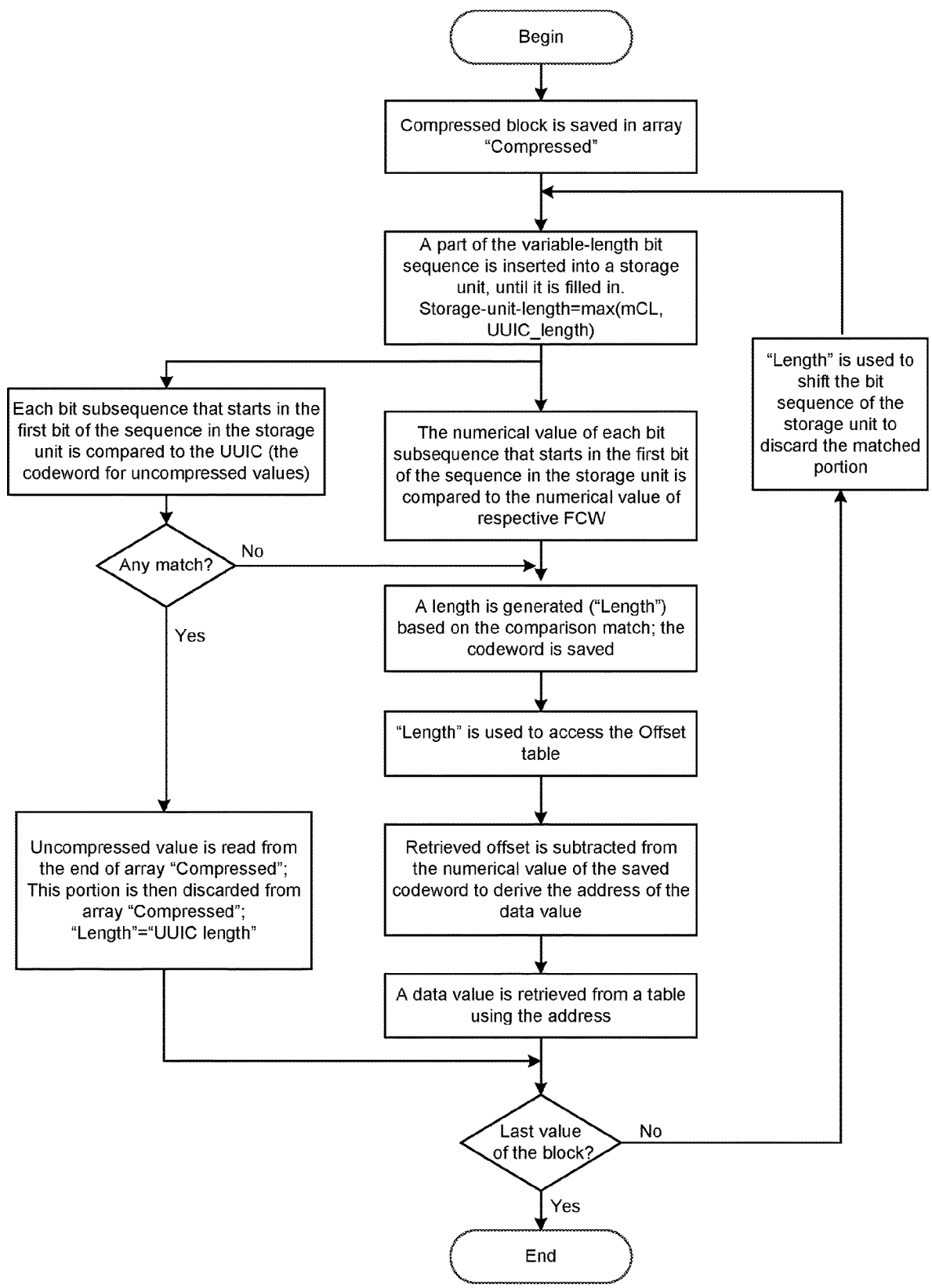
FIG. 32 illustrates an exemplary flow chart of a new method that is built on the top of the method of FIG. 26 to be able to decompress the compressed block of FIG. 13 that contains a mix of compressed and uncompressed values where each uncompressed value is replaced by a unique codeword that corresponds only to all uncompressed values, while the uncompressed values are saved in reverse appearing order in the end of the block.

FIG. 32 illustrates an exemplary flow chart of a decompression method that is built on the basis of the decompression method of FIG. 26 and it is able to decompress the compressed block of FIG. 13 that contains a mix of compressed and uncompressed values where each uncompressed value is replaced by UUIC in the original data value order and the actual uncompressed values are saved in reverse appearing order in the end of the block. The method detects uncompressed values similarly to the decompression method of FIG. 30 by trying to match the UUIC. The difference is that when the UUIC is detected, the uncompressed value is read straightforwardly from the end of the compressed block that is saved in a second storage unit ("Compressed" array). The read uncompressed value is then discarded from this said second storage unit (or the array index is incremented). Furthermore, the UUIC length is assigned to "length" that is the shifting amount of the bit-sequence stored in the storage unit. Otherwise, decompression of the compressed value follows the other path in FIG. 32 and the length of the matched codeword is assigned to the "length". Contrary to the previous two embodiments, the minimum size of the storage unit is defined by the maximum between the length of the maximum variable length codeword (mCL) and the UUIC length.

Figure 20:
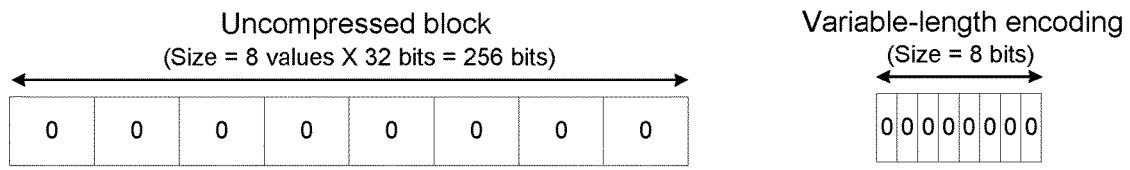
FIG. 20 shows on the left a null uncompressed block, which is a block that contains only zero data values, and on the right the same block compressed with the compressor of FIG. 9, using variable-length encoding assuming that each zero value is replaced by a codeword of the minimum possible width (1 bit).
Figure 21:
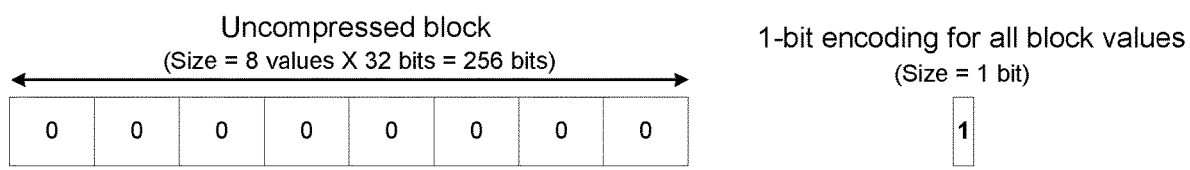
FIG. 21 shows on the left a null uncompressed block, which is a block that contains only zero data values, and on the right the same block compressed using a 1-bit encoding.

Another case that occurs commonly when data compression is applied in the cache/memory subsystem or the transferring network subsystem of a computer system, or in a communication network is blocks of data values filled in with the same common data value. The most common scenario is that the same common data value is the value 0 and such blocks are hence referred to as Null Blocks. Variable-length coding like Huffman coding is bounded to a maximum compression ratio, as one codeword can only replace in the best case a data value. In the embodiment of another uncompressed block of 8 data values where each value is the value 0 as depicted on the left of FIG. 20, the compressed block using Huffman encoding and assuming that the value 0 is so frequent that can be encoded with 1 bit contains 8 bits (1 bit per value), as depicted on the right of FIG. 20. An alternative way to compress such a block is by replacing the whole block of values by one bit, e.g., the bit 1, as is depicted in FIG. 21. In said compression scenario though, if a block contains values other than 0, it is going to be compressed by one of the aforementioned data compression devices. However, extra information needs to be encoded so that said block in compressed form can be distinguished from a null compressed block by the data decompression device. An example approach is to place a bit, e.g., the bit 0, before the rest of variable-length encoded bit sequence to indicate that is a non-null block. Other approaches can be also found by someone skilled in the art.

Figure 22:
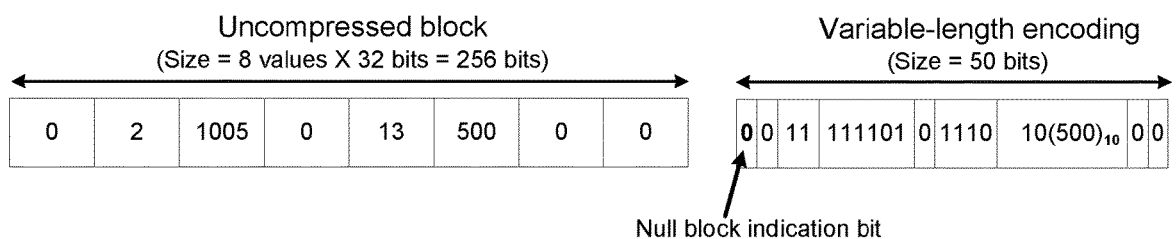
FIG. 22 shows on the left an uncompressed block, which is the same block as in FIG. 11, FIG. 12 and FIG. 13, and on the right the same block in compressed form in a fourth alternative way comprising a one bit indicator, which indicates whether the compressed block is null or not, and a variable-length encoded bit sequence, which comprises a mix of compressed and uncompressed values where each uncompressed value is preceded by a unique variable-length (e.g., Huffman) codeword that corresponds only to all uncompressed values.
Figure 23:
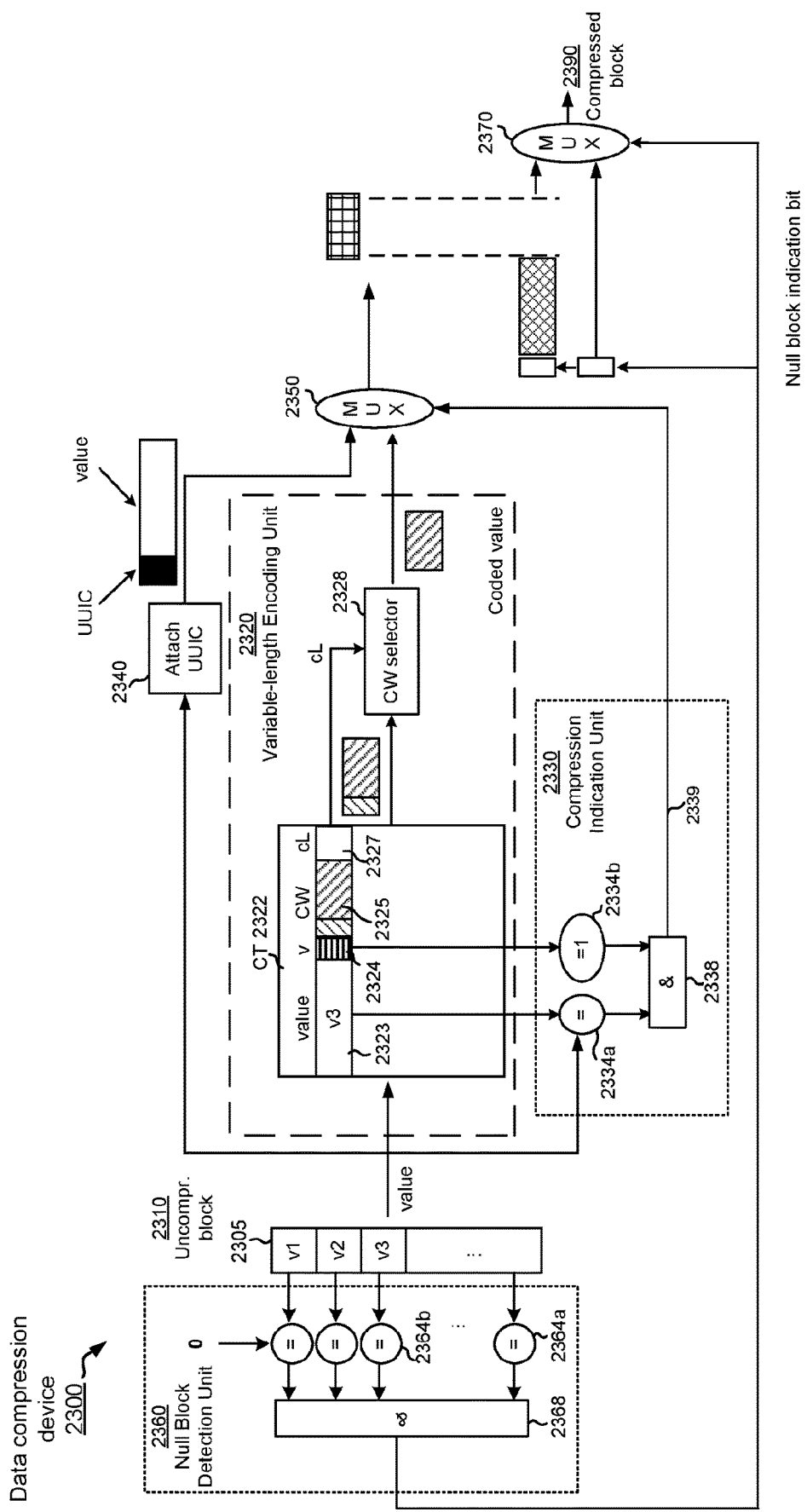
FIG. 23 illustrates a data compression device that is able to compress the uncompressed blocks of FIG. 21 (compressed null block) and FIG. 22 (compressed block that comprises mixes of compressed and uncompressed values), comprising the data compression device of FIG. 16 and a Null Block Detection Unit, which checks whether all the block data values are zero values. In this case, it compresses it using a 1-bit encoding as in FIG. 21; otherwise, it compresses it as in FIG. 22.

A block diagram of an example data compression device that is able to form said compressed blocks of FIG. 21 and FIG. 22 is depicted in FIG. 23. It is based on the data compression device 1600 of FIG. 16, however all the aforementioned data compression devices disclosed in this patent, e.g. devices 1400, 1600 and 1800, could be used as a basis by someone skilled in the art. A new unit in the data compression device 2300 of FIG. 23, in comparison to the data compression device 1600 of FIG. 16, is a Null Block Detection Unit 2360 (on the left of FIG. 23) which compares in a plurality of comparators 2364*a*, 2364*b*, etc, whether all the block data values are equal to the same common data value 0. If it is true, a Null Block Indication bit (i.e., output by an AND gate 2368) is set to '1', and a selector 2370 is controlled accordingly to let the Null Block Indication bit constitute the compressed data block 2390. Otherwise, the Null Block Indication bit is set to '0', and the selector 2370 is controlled accordingly to let the Null Block Indication bit precede the rest of the variable-length encoded bit sequence, which together form the compressed data block 2390 as described above for the different embodiments. The Null Block Detection Unit 2360 could be modified by someone skilled in the art, to compress other kinds of uncompressed data blocks that contain the same common data value, which is not the value 0.

More generally, a data compression device (such as 2300) may comprise any of the data compression devices 1400, 1600 or 1800 as described above, and in addition a common-value detection unit (such as unit 2360) configured to detect when all data values of an uncompressed data block (such as 2310) have a same common block data value (such as the value 0). Such a data compression device is configured, when it is detected that all data values of the uncompressed data block have the same common block data value, to generate a compressed data block (such as 2390) to consist solely of a special-meaning data value indicative of the detected common block data value instead of the aforementioned combination of compressed data values, uncompressed data values and metadata, whereas the data compression device is configured, when it is not detected that all data values of the uncompressed data block have the same common block data value, to generate the compressed data block to comprise a value different from the special-meaning data value followed by the aforementioned combination of compressed data values, uncompressed data values and metadata.

Figure 24A:
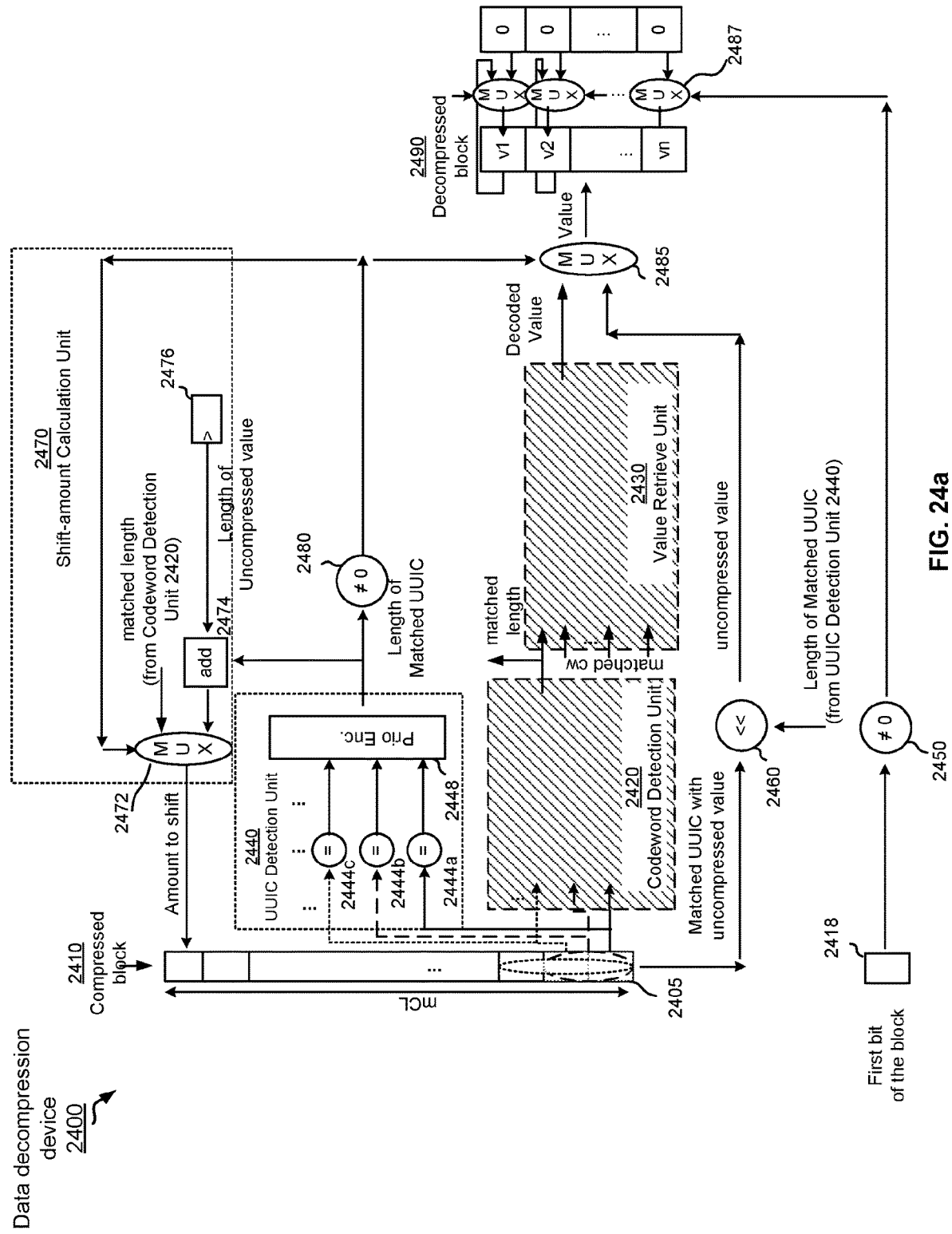
FIG. 24a illustrates a data decompression device that is able to decompress the compressed blocks of FIG. 21 (compressed null block) and FIG. 22 (compressed block that comprises mixes of compressed and uncompressed values), comprising the data decompression device of FIG. 17a and extra logic (on the bottom of FIG. 24) that is able to detect whether the block is compressed as a null block by checking if the first bit of the block is not zero. In this case, all the data values of the decompressed block are assigned the value 0.

A block diagram of an example embodiment of a data decompression device 2400 that is able to decompress said compressed data blocks as depicted in FIG. 21 and FIG. 22, is illustrated in FIG. 24*a* and is built on the basis of the data decompression device 1700 of FIG. 17*a*. However all the aforementioned data decompression devices disclosed in this disclosure, e.g. devices 1500, 1700 and 1900, could be used as a basis by someone skilled in the art. In comparison to the data decompression device 1700 of FIG. 17*a* where the storage unit 1710 saves part of the compressed data block 1710, in the new data decompression device 2400 of FIG. 24*a*, the storage unit comprises a storage sub-unit 2418, which keeps only the first bit of the compressed data block 2410, and a storage sub-unit 2414 which saves part of the compressed data block 2410 as before. In this data decompression device and only in the beginning of decompressing a compressed block, the lead bit (stored in the storage sub-unit 2418) is checked whether it is non-zero (or '1'). If this is true, all the values in the decompressed block 2490 are assigned the value 0 through a plurality of muxes 2495 (on the right of FIG. 24); otherwise (if the lead bit of the compressed data block 2410 is '0'), then the rest of steps as described for the data decompression device 1700 of FIG. 17*a*, are followed to decompress this data block.

More generally, a data decompression device (such as 2400) may comprise any of the data decompression devices 1500, 1700 or 1900 as described above, and in addition a special-meaning data value detector (such as 2450) configured to detect in the beginning of a compressed data block (such as 2410) a special-meaning data value indicative of a common block data value (such as the value 0), Such a data decompression device is configured, when the special-meaning data value is detected, to generate a decompressed data block (such as 2490) by filling it with the common block data value, whereas the data decompression device is configured, when the special-meaning data value is not detected, to generate the decompressed data block as described for any of the embodiments above.

Figure 24B:
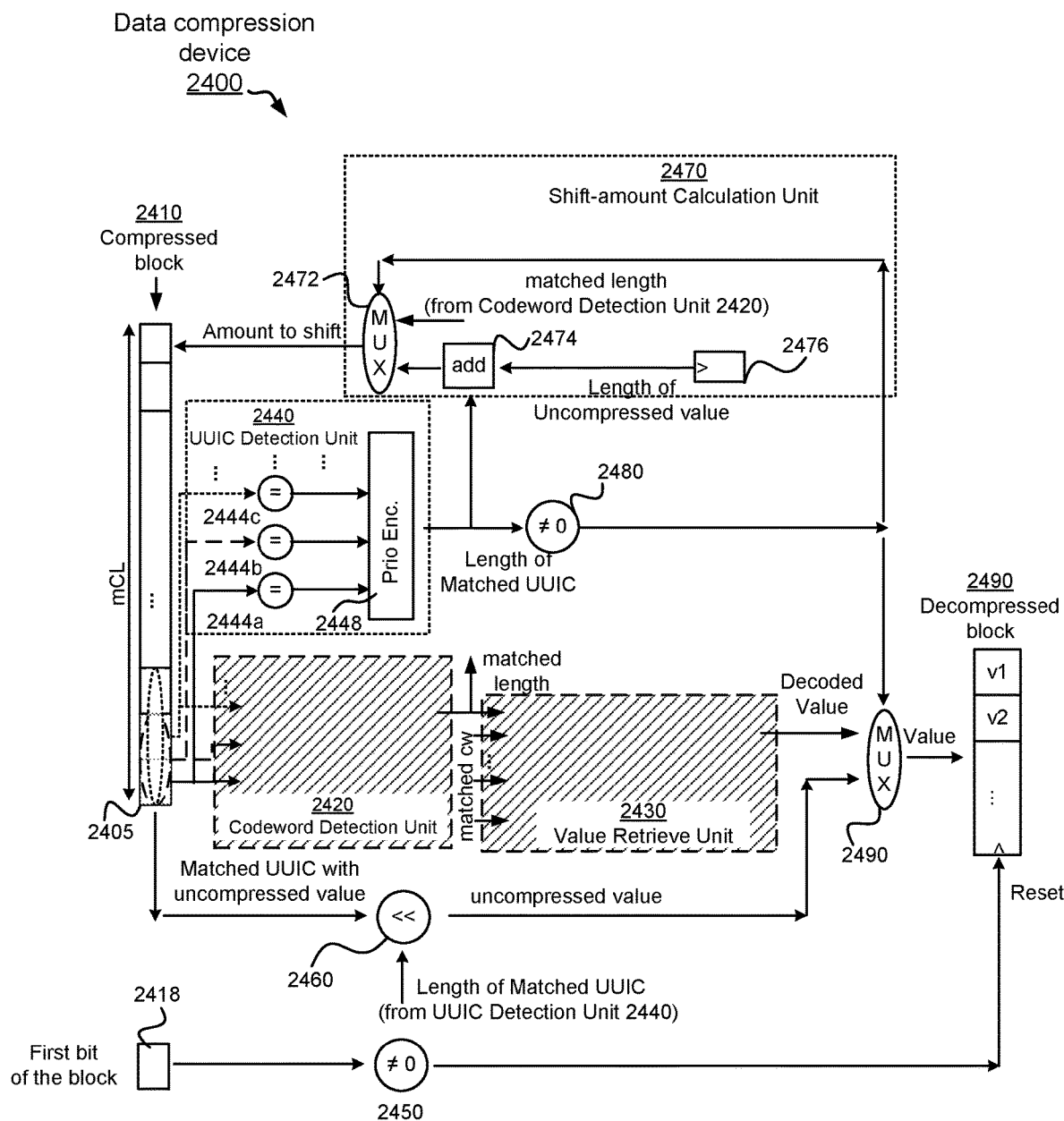
FIG. 24b illustrates an alternative example of the data decompression device of FIG. 24a that is able to decompress the compressed blocks of FIG. 21 (compressed null block) and FIG. 22 (compressed block that comprises mixes of compressed and uncompressed values), comprising the data decompression device of FIG. 17a and extra logic (on the bottom of FIG. 24) that is able to detect whether the block is compressed as a null block by checking whether the first bit of the block is not zero. In this case, all the data values of the decompressed block are reset to the value 0.

An alternative block diagram of the embodiment of said data decompression device is depicted in FIG. 24*b*, where if the lead bit of the compressed block is found to be non-zero, the decompressed block of data values is reset to 0 assuming that the decompressed block is reconstructed in a storage unit that is an array of flip-flops. Other alternative implementations of this data decompression device can be realized by someone skilled in the art. Alternative embodiments of said data decompression device can be realized when any other value appears very commonly within the same block of data values.

Figure 33:
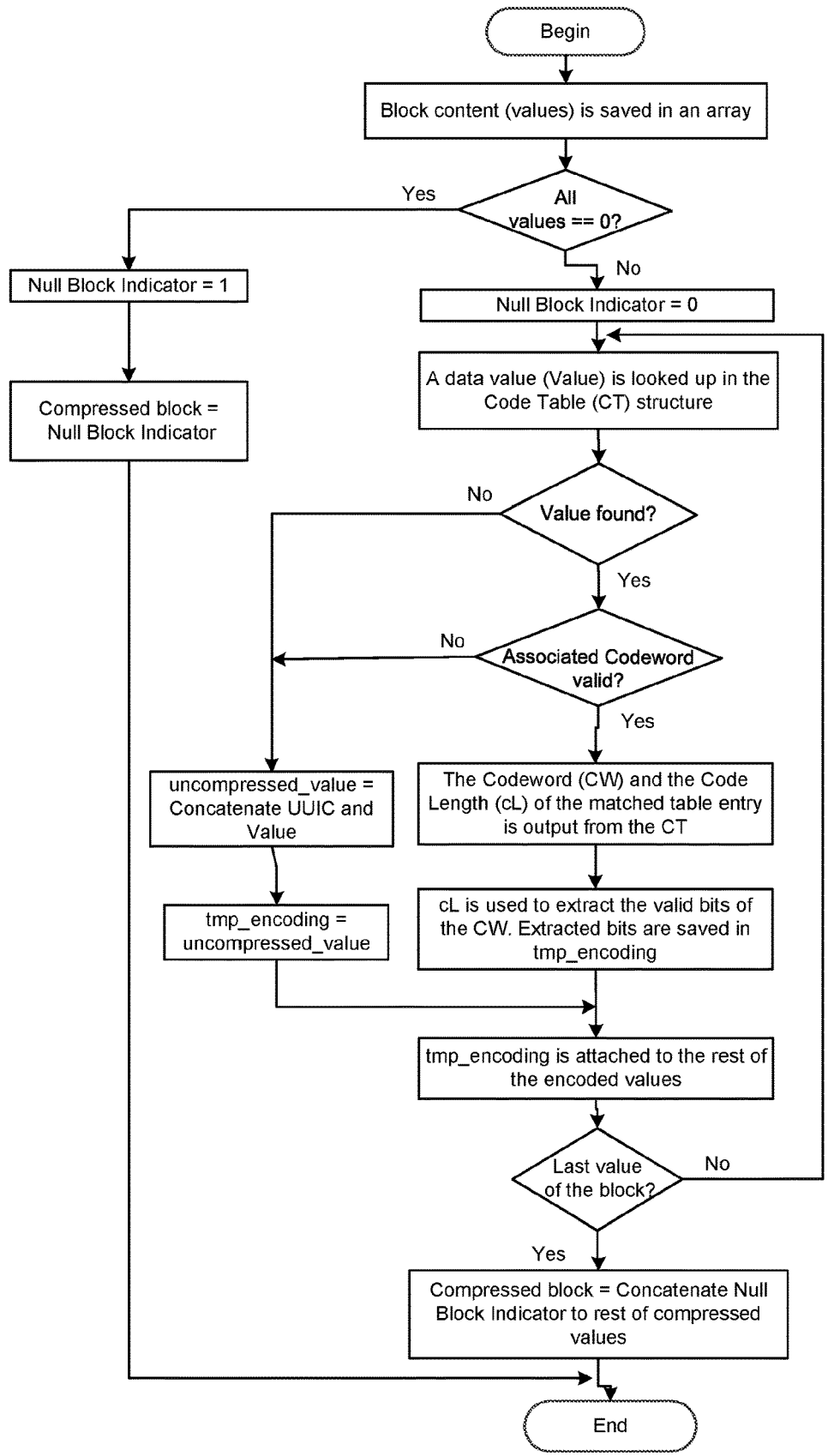
FIG. 33 illustrates an exemplary flow chart of a new method that is built on the top of the compression method of FIG. 29 to also check whether all the block data values are zero values and accordingly set the Null Block Indicator to '1' compressing in this case the block using a 1-bit encoding as in FIG. 21; otherwise, it compresses it as in FIG. 22 setting the zero bit indicator to 0.

FIG. 33 illustrates an exemplary flow chart of a compression method that is built based on the compression method of FIG. 29 and it also checks whether all the block data values are zero values so that it compresses said block (referred to as Null block) in a more efficient way as it is depicted in FIG. 21; otherwise it compresses it as it is depicted in FIG. 22. This is done by checking in the beginning of compression whether all values are equal to value 0 and accordingly setting the Null Block Indicator to '1' (the Null Block Indicator constitutes the compressed block itself); otherwise, it sets the Null Block Indicator to '0' and the block is compressed using the alternative path that comprises the compression method of FIG. 29 but the Null Block Indicator is placed in the beginning of the compressed block. In an alternative embodiment of said compression method, comparing each of the values with the value 0 can take place while each value is compressed using the alternative path that comprises the compression method of FIG. 29. If all of them are equal to the value 0, then the block is compressed as a Null block. Other embodiments of this compression method can attempt to compress either statically or dynamically other values that appear more commonly than the value 0.

Figure 34:
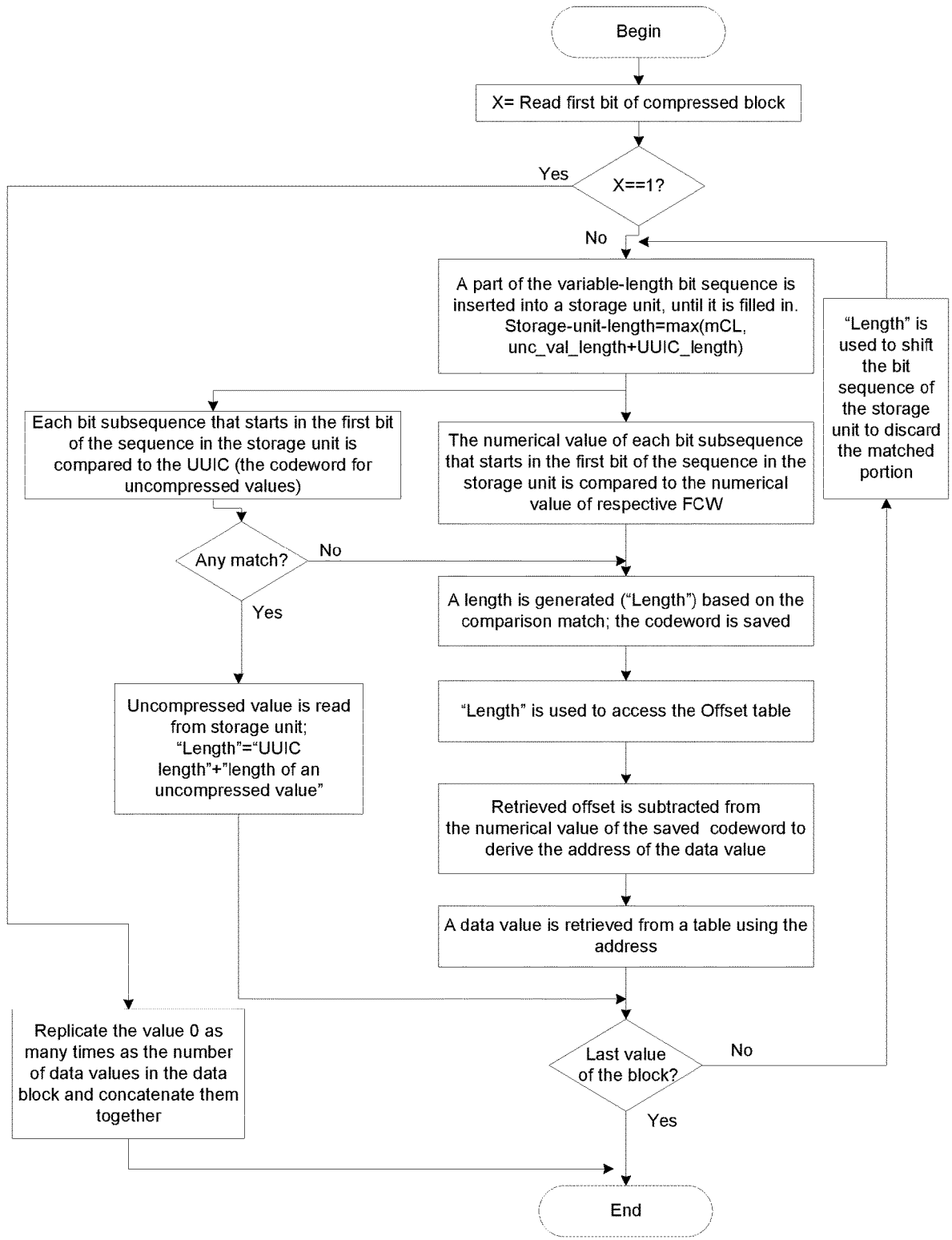
FIG. 34 illustrates an exemplary flow chart of a new method that is built on the top of the method of FIG. 30 to be able to detect whether the block is compressed as a null block by checking whether the first bit of the block equals to 1. In this case, all the data values of the decompressed block are assigned the value 0; otherwise, the block is decompressed by the method illustrated in FIG. 30.

FIG. 34 illustrates an exemplary flow chart of a decompression method that is built based on the decompression method of FIG. 30 and it is able to detect whether the block is compressed as a null block by checking whether the first bit of the block equals to '1'. In this case, all the data values of the decompressed block are assigned the value 0; otherwise, the block is decompressed using the alternative path that comprises the method illustrated in FIG. 30. Other embodiments of this decompression method can include either statically or dynamically other values that appear more commonly than the value 0.

In all the aforementioned embodiments of a data compression device and/or a data decompression device, delay units such as flip flops can be inserted, by those skilled in the art, so that compression of one block's data value or/and decompression of one compressed block's value can be pipelined into a plurality of stages to reduce the clock cycle time and increase the processing (compression or/and decompression) throughput.

Furthermore, alternative embodiments of the data compression devices and/or data decompression devices disclosed in this disclosure can be parallelized, by those skilled in the art and according to teachings which are commonly known per se, by compressing a plurality of block's data values or/and decompressing a plurality of compressed block's data values at the same time. In such a case, the decompressor design needs to be accordingly modified by someone skilled in the art.

The respective data compression devices 1400, 1600, 1800, 2300 in FIGS. 14, 16, 18 and 23 may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), etc. The functionality of the respective data compression methods described in this disclosure may for instance be performed by the respective data compression devices 1400, 1600, 1800, 2300 being appropriately configured, or as respective computer program products comprising code instructions which, when loaded and executed by a general-purpose processing device such as a CPU or DSP, cause performance of the respective methods.

The respective data decompression devices 1500, 1700, 1900, 2400 in FIGS. 15, 17, 19, 24*a* and 24*b* may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), etc. The functionality of the respective data decompression methods described in this disclosure may for instance be performed by the respective data decompression devices 1500, 1700, 1900, 2400 being appropriately configured, or as respective computer program products comprising code instructions which, when loaded and executed by a general-purpose processing device such as a CPU or DSP (for instance any of the processing units P1 . . . Pn of FIGS. 1-5), cause performance of the respective methods.

The example embodiments disclosed herein present methods, devices and systems for data block compression and decompression in or for a cache/memory subsystem, in or for a data transferring subsystem in a computer system, or in or for a communication network, in order to store or transfer information more compactly.

Figure 35:
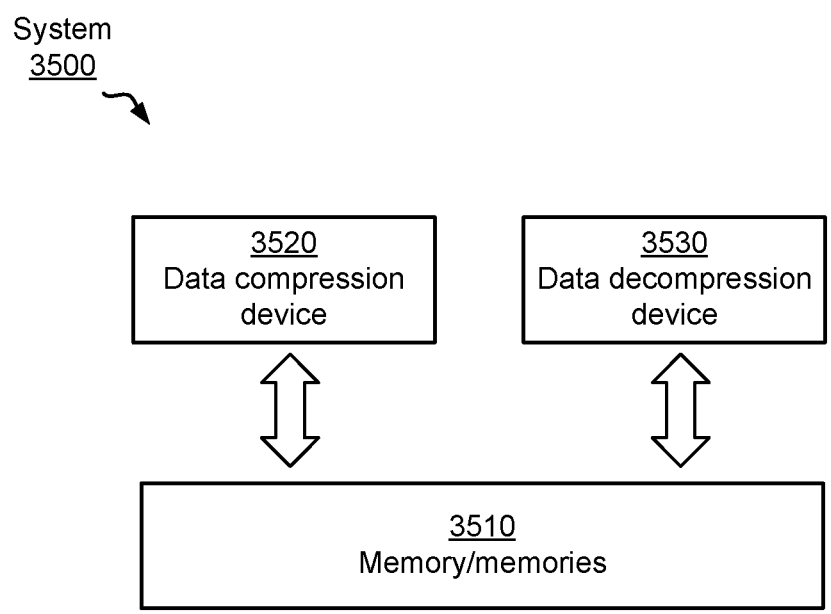
FIG. 35 illustrates a general system according to the invention.

FIG. 35 illustrates a general system 3500 according to the invention. The system comprises one or more memories 3510, a data compression device 3520 (such as, for instance, any of the data compression devices 1400, 1600, 1800, 2300) and a data decompression device 3530 (such as, for instance, any of the data decompression devices 1500, 1700, 1900, 2400). Advantageously, the system 3500 is a computer system (such as any of the computer systems 100-500 of FIGS. 1-5), and said one or more memories 3510 is/are cache memory/memories (such as any of the cache memories L1-L3 of FIGS. 1-5), random access memory/memories (such as any of the memories 130-530 of FIGS. 1-5), or secondary storage/storages. Alternatively, the system 3500 is a data communication system (such as the communication networks 600, 700 of FIGS. 6-7), wherein said one or more memories 3510 may be data buffers associated with transmitting and receiving nodes in the data communication system (such as transmitter 610, 710 and receiver 620, 720 of FIGS. 6-7).

Although the inventive aspects are described using the example embodiments, they are not limited to the disclosed embodiments but they cover alternative embodiments that can be realized by someone skilled in the art.

It shall be noticed that alternative inventive aspects, directed inter alia at the related but presently not claimed designs shown in and described for FIGS. 11, 14 and 15, are defined in the following numbered clauses.

I. A data compression device for compressing an uncompressed data block that comprises one or a plurality of data values into a compressed data block, the data compression device comprising:
a compressor configured to compress data values of the uncompressed data block into corresponding variable-length codewords;
a detector configured to detect data values of the uncompressed data block that cannot be compressed by said compressor; and
a compressed data block generator configured to generate the compressed data block by combining:
compressed data values in the form of the variable-length codewords corresponding to the data values of the uncompressed data block as compressed by the compressor;
uncompressed data values in the form of the detected data values of the uncompressed data block that cannot be compressed by said compressor; and
metadata to indicate the uncompressed data values.

II. The data compression device as defined in clause I, wherein the compressed data block generator comprises at least one selector being responsive to a detection result of the detector and configured to generate the compressed data block by combining the variable-length codewords, the detected data values and the metadata in one or more steps.

III. The data compression device as defined in any of the preceding clauses, wherein the detector is configured to detect data values of the uncompressed data block that cannot be compressed by said compressor as one or more of the following:
data values which do not exist in a code table of the compressor,
data values which exist in the code table but lack codewords in the code table of the compressor,
data values which exist in the code table, have codewords therein but are indicated as invalid in the code table of the compressor.

IV. The data compression device as defined in any preceding clause,
wherein the compressed data block generator comprises a compression status register for storing said metadata in the form of a compression status mask to indicate positions of compressed data values and uncompressed data values in the compressed data block; and
wherein the compressed data block generator is configured to include the compression status mask from the compression status register in the generated compressed data block.

V. The data compression device as defined in clause IV, the compressed data block generator comprising a concatenator, wherein the compressed data block generator is configured to:
iteratively build a variable-length encoded bit sequence by adding a compressed data value in the form of the variable-length codeword, or an uncompressed data value, depending on a detection result of the detector in the order of appearance of the data values in the uncompressed data block, while updating the compression status mask at a corresponding position in the compression status register accordingly; and when all data values of the uncompressed data block have been processed, generate the compressed data block by the concatenator concatenating the compression status mask and the variable-length encoded bit sequence.

VI. The data compression device as defined in any preceding clause, further comprising a common-value detection unit configured to detect when all data values of the uncompressed data block have a same common block data value,
wherein the data compression device is configured, when it is detected that all data values of the uncompressed data block have the same common block data value, to generate the compressed data block to consist solely of a special-meaning data value indicative of the detected common block data value instead of the aforementioned combination of compressed data values, uncompressed data values and metadata; and
wherein the data compression device is configured, when it is not detected that all data values of the uncompressed data block have the same common block data value, to generate the compressed data block to comprise a value different from the special-meaning data value followed by the aforementioned combination of compressed data values, uncompressed data values and metadata.

VII. A data decompression device for decompressing a compressed data block into a decompressed data block that comprises one or a plurality of data values, the data decompression device comprising:
a decompressor configured to decompress variable-length codewords of the compressed data block into corresponding decompressed data values; and
a decompressed data block generator configured to:
detect metadata in the compressed data block, said metadata indicating uncompressed data values included in the compressed data block; and
based on the detected metadata, generate the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

VIII. The data decompression device as defined in clause VII, wherein the decompressed data block generator is configured to:

retrieve, from said compressed data block, said metadata in the form of a compression status mask indicating positions of compressed data values and uncompressed data values in the compressed data block; and generate the decompressed data block by controlling, for each data value in the compressed data block, a selector to select a decompressed data value from the decompressor or an uncompressed data value from the compressed data block, based on a bit value at a corresponding position in the compression status mask.

IX. The data decompression device as defined in any of clauses VII-VIII, further comprising a special-meaning data value detector configured to detect in the beginning of the compressed data block a special-meaning data value indicative of a common block data value, wherein the data decompression device is configured, when the special-meaning data value is detected, to generate the decompressed data block by filling it with the common block data value; and wherein the data decompression device is configured, when the special-meaning data value is not detected, to generate the decompressed data block as described in any of clauses VII-VIII.

X. A data compression method for compressing an uncompressed data block that comprises one or a plurality of data values into a compressed data block, the data compression method comprising:

compressing data values of the uncompressed data block into corresponding variable-length codewords;

detecting data values of the uncompressed data block that cannot be compressed by said compressor; and generating the compressed data block by combining:
compressed data values in the form of the variable-length codewords corresponding to the data values of the uncompressed data block as compressed by the compressor;
uncompressed data values in the form of the detected data values of the uncompressed data block that cannot be compressed by said compressor; and
metadata to indicate the uncompressed data values.

This data compression method may include any of the functional features of the data compression device according to clauses I-VI.

XI. A data decompression method for decompressing a compressed data block into an decompressed data block that comprises one or a plurality of data values, the data decompression method comprising:

decompressing variable-length codewords of the compressed data block into corresponding decompressed data values;

detecting metadata in the compressed data block, said metadata indicating uncompressed data values included in the compressed data block; and based on the detected metadata, generating the decompressed data block by combining decompressed data values from the decompressor and uncompressed data values from the compressed data block, such that the order of the data values of the generated decompressed data block is the same as the order in which the data values appeared in an uncompressed data block uncompressed data block prior to data compression which produced the compressed data block.

This data decompression method may include any of the functional features of the data compression device according to clauses VII-IX.

XII. A system comprising one or more memories, a data compression device according to any of clauses I-VI and a data decompression device according to any of clauses VII-IX.

XIII. The system as defined in clause XII, wherein the system is a computer system and wherein said one or more memories are from the group consisting of:
cache memories,
random access memories, and
secondary storages.

XIV. The system as defined in clause XII, wherein the system is a data communication system and wherein said one or more memories are data buffers.

XV. A computer program product comprising code instructions which, when loaded and executed by a processing device, cause performance of the method according to clause X.

XVI. A computer program product comprising code instructions which, when loaded and executed by a processing device, cause performance of the method according to clause XI.

The invention claimed is:

1. A data compression device for compressing an uncompressed data block that comprises one or a plurality of data values into a compressed data block, the data compression device comprising:

a compressor configured to compress data values of the uncompressed data block into corresponding variable-length codewords;

a detector configured to detect data values of the uncompressed data block that cannot be compressed by said compressor; and a compressed data block generator configured to generate the compressed data block by combining:
compressed data values in the form of the variable-length codewords corresponding to the data values of the uncompressed data block as compressed by the compressor;
uncompressed data values in the form of the detected data values of the uncompressed data block that cannot be compressed by said compressor; and
metadata to indicate the uncompressed data values, wherein the metadata is a unique special-meaning codeword.

2. The data compression device as defined in claim 1, wherein the unique special-meaning codeword is one which has been generated together with the variable-length codewords of said compressor at the time of code generation.

3. The data compression device as defined in claim 2, wherein the unique special-meaning codeword has been generated by calculating or estimating the frequency of occurrence of all data values that did not appear in a value-frequency table at the time of code generation, their frequency of occurrence in comparison to the total number of occurring data values affecting a width of the unique special-meaning codeword.

4. The data compression device as defined in claim 1, wherein the compressed data block generator is configured to:
attach the unique special-meaning codeword to each uncompressed data value when generating the compressed data block.

5. The data compression device as defined in claim 4, wherein the compressed data block generator is configured to generate the compressed data block by iteratively building a variable-length encoded bit sequence by adding a compressed data value in the form of the variable-length codeword, or an uncompressed data value with the attached unique special-meaning codeword, depending on a detection result of the detector in the order of appearance of the data values in the uncompressed data block.

6. The data compression device as defined in claim 1, wherein the compressed data block generator is configured to:
   for all detected data values of the uncompressed data block that cannot be compressed by said compressor, include the unique special-meaning codeword but not the respective detected data values in the generated compressed data block in the order of appearance of the data values in the uncompressed data block; and
   attach the detected data values of the uncompressed data block that cannot be compressed by said compressor at an end of the generated compressed data block, in a reverse order compared to the order in which the detected data values appeared in the uncompressed data block.

7. The data compression device as defined in claim 6, the compressed data block generator comprising a storage unit and a concatenator, wherein the compressed data block generator is configured to generate the compressed data block by:
   iteratively building a variable-length encoded bit sequence by adding each compressed data value in the form of the variable-length codeword from the compressor in the order of appearance of the data values in the uncompressed data block;
   each time said detector detects a data value in the uncompressed data block that cannot be compressed by said compressor, adding the unique special-meaning codeword to the variable-length encoded bit sequence and saving the detected data value in the storage unit, wherein detected data values are saved in the storage unit in a reverse order compared to the order of appearance of the data values in the uncompressed data block; and
   when all data values of the uncompressed data block have been processed, generating the compressed data block by the concatenator concatenating the variable-length encoded bit sequence and the saved data values in the storage unit.

8. The data compression device as defined in claim 1, further comprising a common-value detection unit configured to detect when all data values of the uncompressed data block have a same common block data value,
   wherein the data compression device is configured, when it is detected that all data values of the uncompressed data block have the same common block data value, to generate the compressed data block to consist solely of a special-meaning data value indicative of the detected common block data value instead of the aforementioned combination of compressed data values, uncompressed data values and metadata; and
   wherein the data compression device is configured, when it is not detected that all data values of the uncompressed data block have the same common block data value, to generate the compressed data block to comprise a value different from the special-meaning data value followed by the aforementioned combination of compressed data values, uncompressed data values and metadata.

9. The data compression device as defined in claim 1, wherein the compressed data block generator comprises at least one selector being responsive to a detection result of the detector and configured to generate the compressed data block by combining the variable-length codewords, the detected data values and the metadata in one or more steps.

10. The data compression device as defined in claim 1, wherein the detector is configured to detect data values of the uncompressed data block that cannot be compressed by said compressor as one or more of the following:
   data values which do not exist in a code table of the compressor,
   data values which exist in the code table but lack codewords in the code table of the compressor,
   data values which exist in the code table, have codewords therein but are indicated as invalid in the code table of the compressor.

11. A data decompression device for decompressing a compressed data block into a decompressed data block that comprises one or a plurality of data values, the data decompression device comprising:
   a decompressor configured to decompress variable-length codewords of the compressed data block into corresponding decompressed data values; and
   a decompressed data block generator configured to:
   detect metadata in the compressed data block, said metadata being a unique special-meaning codeword indicating uncompressed data values included in the compressed data block; and
   based on the detected metadata, generate the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

12. The data decompression device as defined in claim 11, wherein the decompressed data block generator is configured to:
   detect the unique special-meaning codeword being comprised in the compressed data block and generate a resulting control signal;
   remove the detected unique special-meaning codeword from an associated uncompressed data value to which the unique special-meaning codeword was attached; and
   generate the decompressed data block by controlling, for each data value in the compressed data block, a selector to select a decompressed data value from the decompressor or an uncompressed data value for which the detected unique special-meaning codeword has been removed, based on said control signal.

13. The data decompression device as defined in claim 11, wherein the decompressed data block generator is configured to:
   detect the unique special-meaning codeword being comprised in the compressed data block and generate a resulting control signal; and
   generate the decompressed data block by controlling, for each data value of the compressed data block and based on said control signal, a selector to select a decompressed data value from the decompressor in the order of appearance of the compressed data values in the compressed data block, or an uncompressed data value from the compressed data block in a reverse order compared to the order in which the uncompressed data values appeared in the compressed data block.

14. The data decompression device as defined in claim 13, wherein the decompressed data block generator is configured to:
   store a copy of at least a part of the compressed data block in reverse order in a storage unit, the trailing end of the compressed data block being stored at the beginning of the storage unit;
   increment an uncompressed data values counter each time the unique special-meaning codeword is detected as comprised in the compressed data block; and
   use the uncompressed data values counter as a pointer to a memory position in the storage unit to provide an uncompressed data value to the selector.

15. The data decompression device as defined in claim 11, further comprising a special-meaning data value detector configured to detect in the beginning of the compressed data block a special-meaning data value indicative of a common block data value,
   wherein the data decompression device is configured, when the special-meaning data value is detected, to generate the decompressed data block by filling it with the common block data value; and
   wherein the data decompression device is configured, when the special-meaning data value is not detected, to generate the decompressed data block as described in claim 11.

16. A data compression method for compressing an uncompressed data block that comprises one or a plurality of data values into a compressed data block, the data compression method comprising:
   compressing data values of the uncompressed data block into corresponding variable-length codewords;
   detecting data values of the uncompressed data block that cannot be compressed; and
   generating the compressed data block by combining:
   compressed data values in the form of the variable-length codewords corresponding to the data values of the uncompressed data block as compressed by the compressor;
   uncompressed data values in the form of the detected data values of the uncompressed data block that cannot be compressed by said compressor; and
   metadata to indicate the uncompressed data values, wherein the metadata is a unique special-meaning codeword.

17. The data compression method as defined in claim 16, wherein the unique special-meaning codeword is generated together with the variable-length codewords at the time of code generation.

18. The data compression method as defined in claim 17, wherein the unique special-meaning codeword is generated by calculating or estimating the frequency of occurrence of all data values that did not appear in a value-frequency table at the time of code generation, their frequency of occurrence in comparison to the total number of occurring data values affecting a width of the unique special-meaning codeword.

19. The data compression method as defined in claim 16, further comprising:
   attaching the unique special-meaning codeword to each uncompressed data value when generating the compressed data block.

20. The data compression method as defined in claim 19, further comprising:
   generating the compressed data block by iteratively building a variable-length encoded bit sequence by adding a compressed data value in the form of the variable-length codeword, or an uncompressed data value with the attached unique special-meaning codeword, depending on a detection result of the detecting step in the order of appearance of the data values in the uncompressed data block.

21. The data compression method as defined in claim 16, further comprising:
   for all detected data values of the uncompressed data block that cannot be compressed by said compressor, including the unique special-meaning codeword but not the respective detected data values in the generated compressed data block in the order of appearance of the data values in the uncompressed data block; and
   attaching the detected data values of the uncompressed data block that cannot be compressed by said compressor at an end of the generated compressed data block, in a reverse order compared to the order in which the detected data values appeared in the uncompressed data block.

22. The data compression method as defined in claim 21, further comprising generating the compressed data block by:
   iteratively building a variable-length encoded bit sequence by adding each compressed data value in the form of its variable-length codeword in the order of appearance of the data values in the uncompressed data block;
   each time a data value in the uncompressed data block is detected that cannot be compressed, adding the unique special-meaning codeword to the variable-length encoded bit sequence and saving the detected data value, wherein detected data values are saved in a reverse order compared to the order of appearance of the data values in the uncompressed data block; and
   when all data values of the uncompressed data block have been processed, generating the compressed data block by concatenating the variable-length encoded bit sequence and the saved data values.

23. The data compression method as defined in claim 16, further comprising detecting when all data values of the uncompressed data block have a same common block data value,
   wherein, when it is detected that all data values of the uncompressed data block have the same common block data value, the compressed data block is generated to consist solely of a special-meaning data value indicative of the detected common block data value instead of the aforementioned combination of compressed data values, uncompressed data values and metadata; and
   wherein, when it is not detected that all data values of the uncompressed data block have the same common block data value, the compressed data block is generated to comprise a value different from the special-meaning data value followed by the aforementioned combination of compressed data values, uncompressed data values and metadata.

24. The data compression method as defined in claim 16, wherein the data values of the uncompressed data block that cannot be compressed are detected as one or more of the following:
   data values which do not exist in a code table,
   data values which exist in the code table but lack codewords in the code table,
   data values which exist in the code table, have codewords therein but are indicated as invalid in the code table.

25. A data decompression method for decompressing a compressed data block into an decompressed data block that comprises one or a plurality of data values, the data decompression method comprising:
- decompressing variable-length codewords of the compressed data block into corresponding decompressed data values;
- detecting metadata in the compressed data block, said metadata being a unique special-meaning codeword indicating uncompressed data values included in the compressed data block; and
- based on the detected metadata, generating the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

26. The data decompression method as defined in claim 25, further comprising:
- detecting the unique special-meaning codeword being comprised in the compressed data block and generating a resulting control signal;
- removing the detected unique special-meaning codeword from an associated uncompressed data value to which the unique special-meaning codeword was attached; and
- generating the decompressed data block by selecting, for each data value in the compressed data block and based on said control signal, a decompressed data value or an uncompressed data value for which the detected unique special-meaning codeword has been removed.

27. The data decompression method as defined in claim 25, further comprising:
- detecting the unique special-meaning codeword being comprised in the compressed data block and generating a resulting control signal; and
- generating the decompressed data block by selecting, for each data value of the compressed data block and based on said control signal, a decompressed data value in the order of appearance of the compressed data values in the compressed data block, or an uncompressed data value from the compressed data block in a reverse order compared to the order in which the uncompressed data values appeared in the compressed data block.

28. The data decompression method as defined in claim 27, further comprising:
- storing a copy of at least a part of the compressed data block in reverse order in a storage unit, the trailing end of the compressed data block being stored at the beginning of the storage unit;
- incrementing an uncompressed data values counter each time the unique special-meaning codeword is detected as being comprised in the compressed data block; and
- using the uncompressed data values counter as a pointer to a memory position in the storage unit to provide an uncompressed data value for the selecting step.

29. A method comprising:
- detecting in the beginning of a compressed data block a special-meaning data value indicative of a common block data value,
- wherein, when the special-meaning data value is detected, a decompressed data block is generated by filling it with the common block data value; and
- wherein, when the special-meaning data value is not detected, the decompressed data block is generated by:
  - decompressing variable-length codewords of the compressed data block into corresponding decompressed data values;
  - detecting metadata in the compressed data block, said metadata being a unique special-meaning codeword indicating uncompressed data values included in the compressed data block; and
  - based on the detected metadata, generating the decompressed data block by combining decompressed data values from the decompressor and uncompressed data values from the compressed data block, such that the order of the data values of the generated decompressed data block is the same as the order in which the data values appeared in an uncompressed data block uncompressed data block prior to data compression which produced the compressed data block.

30. A system comprising:
- one or more memories;
- a data compression device for compressing an uncompressed data block that comprises one or a plurality of data values into a compressed data block, the data compression device comprising:
  - a compressor configured to compress data values of the uncompressed data block into corresponding variable-length codewords;
  - a detector configured to detect data values of the uncompressed data block that cannot be compressed by said compressor; and
  - a compressed data block generator configured to generate the compressed data block by combining:
    - compressed data values in the form of the variable-length codewords corresponding to the data values of the uncompressed data block as compressed by the compressor;
    - uncompressed data values in the form of the detected data values of the uncompressed data block that cannot be compressed by said compressor;
  - metadata to indicate the uncompressed data values, wherein the metadata is a unique special-meaning codeword; and
- a data decompression device for decompressing a compressed data block into a decompressed data block that comprises one or a plurality of data values, the data decompression device comprising:
  - a decompressor configured to decompress variable-length codewords of the compressed data block into corresponding decompressed data values; and
  - a decompressed data block generator configured to:
    - detect metadata in the compressed data block, said metadata being a unique special-meaning codeword indicating uncompressed data values included in the compressed data block; and
    - based on the detected metadata, generate the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

31. The system as defined in claim 30, wherein the system is a computer system and wherein said one or more memories are from the group consisting of:

cache memories,
random access memories, and
secondary storages.

32. The system as defined in claim 30, wherein the system is a data communication system and wherein said one or more memories are data buffers.

33. One or more non-transitory computer readable media storing processor executable instructions which, when executed by at least one processor, cause the at least one processor to:
  compress data values of an uncompressed data block into corresponding variable-length codewords;
  detect data values of the uncompressed data block that cannot be compressed; and
  generate the compressed data block by combining:
  compressed data values in the form of the variable-length codewords corresponding to the data values of the uncompressed data block as compressed by the compressor;
  uncompressed data values in the form of the detected data values of the uncompressed data block that cannot be compressed by said compressor; and
  metadata to indicate the uncompressed data values, wherein the metadata is a unique special-meaning codeword.

34. One or more non-transitory computer readable media storing processor executable instructions which, when executed by at least one processor, cause the at least one processor to:
  decompress variable-length codewords of the compressed data block into corresponding decompressed data values;
  detect metadata in the compressed data block, said metadata being a unique special-meaning codeword indicating uncompressed data values included in the compressed data block; and
  based on the detected metadata, generate the decompressed data block by combining decompressed data values from the decompressor and uncompressed data values from the compressed data block, such that the order of the data values of the generated decompressed data block is the same as the order in which the data values appeared in an uncompressed data block prior to data compression which produced the compressed data block.

* * * * *